US011271136B2

(12) United States Patent
Lee

(10) Patent No.: US 11,271,136 B2
(45) Date of Patent: Mar. 8, 2022

(54) LIGHT EMITTING DEVICE

(71) Applicant: SEOUL VIOSYS CO., LTD., Ansan-si (KR)

(72) Inventor: Chung Hoon Lee, Ansan-si (KR)

(73) Assignee: SEOUL VIOSYS CO., LTD (*) Notice: Subject to any disclaimer, the term of this patent is extended or adjusted under 35 U.S.C. 154(b) by 171 days.

(21) Appl. No.: 16/672,676

(22) Filed: Nov. 4, 2019

(65) Prior Publication Data
US 2020/0144448 A1 May 7, 2020

Related U.S. Application Data

(60) Provisional application No. 62/756,935, filed on Nov. 7, 2018.

(51) Int. Cl.
H01L 33/00 (2010.01)
H01L 33/44 (2010.01)
H01L 33/22 (2010.01)
H01L 27/15 (2006.01)
H01L 33/38 (2010.01)
(Continued)

(52) U.S. Cl.
CPC ............ *H01L 33/22* (2013.01); *H01L 27/156* (2013.01); *H01L 33/382* (2013.01); *H01L 33/44* (2013.01); *H01L 33/007* (2013.01); *H01L 33/0093* (2020.05); *H01L 33/06* (2013.01); *H01L 33/32* (2013.01); *H01L 33/42* (2013.01); *H01L 2933/0016* (2013.01); *H01L 2933/0025* (2013.01)

(58) Field of Classification Search
CPC ....... H01L 33/22; H01L 33/20; H01L 33/382; H01L 33/44; H01L 27/156; H01L 33/58; H01L 33/06; H01L 2933/0016; H01L 33/32; H01L 2933/0091; H01L 33/0093; H01L 33/42; H01L 2933/0025; H01L 33/007
See application file for complete search history.

(56) References Cited

U.S. PATENT DOCUMENTS 6,756,739 B2   6/2004 Miyake et al.
7,413,918 B2 * 8/2008 Tran ..................... H01L 33/22
                                                    257/E33.053
(Continued)

FOREIGN PATENT DOCUMENTS

JP    2002-289357    10/2002
JP    2008-251561    10/2008
(Continued)

OTHER PUBLICATIONS

International Search Report dated Feb. 17, 2020 in International Application No. PCT/KR2019/015090.

*Primary Examiner* — Savitri Mulpuri
(74) *Attorney, Agent, or Firm* — H.C. Park & Associates, PLC

(57) ABSTRACT

A light emitting device including a substrate having a first surface and a second surface opposing the first surface, a light emitting structure disposed on the first surface of the substrate and defining a light emitting area, and a first light shielding layer disposed on the second surface of the substrate and exposing at least a portion of the light emitting area, in which the second surface of the substrate has a rough surface that overlaps at least a portion the light emitting area.

15 Claims, 25 Drawing Sheets

(51) Int. Cl.
  *H01L 33/32* (2010.01)
  *H01L 33/06* (2010.01)
  *H01L 33/42* (2010.01)

(56) References Cited

U.S. PATENT DOCUMENTS

| | | | |
|---|---|---|---|
| 7,973,466 B2 | 7/2011 | Oh et al. | |
| 8,318,519 B2* | 11/2012 | Doan | H01L 33/0093 |
| | | | 438/33 |
| 8,643,040 B2 | 2/2014 | Lee et al. | |
| 9,608,168 B2* | 3/2017 | Chae | H01L 33/54 |
| 9,608,234 B2 | 3/2017 | Kim et al. | |
| 11,005,012 B2* | 5/2021 | Lopez | H01L 33/502 |
| 2007/0190676 A1* | 8/2007 | Chu | H01L 33/22 |
| | | | 438/22 |
| 2014/0103391 A1* | 4/2014 | Haruta | H01L 33/0075 |
| | | | 257/103 |
| 2014/0145233 A1* | 5/2014 | Lee | H01L 33/38 |
| | | | 257/98 |
| 2016/0197325 A1* | 7/2016 | Alvarado Chacon | |
| | | | H01M 10/0525 |
| | | | 429/188 |
| 2017/0066168 A1* | 3/2017 | Ludwig | H01L 33/58 |
| 2019/0067519 A1* | 2/2019 | Niwa | H01L 33/26 |
| 2019/0081215 A1* | 3/2019 | Inazu | H01L 33/22 |
| 2019/0229238 A1* | 7/2019 | Niwa | H01L 33/32 |
| 2020/0135997 A1* | 4/2020 | Hu | H01L 33/10 |
| 2020/0144465 A1* | 5/2020 | Lee | H01L 33/58 |

FOREIGN PATENT DOCUMENTS

| KR | 10-2005-0094561 | 9/2005 |
|---|---|---|
| KR | 10-2015-0102179 | 9/2015 |
| KR | 10-1769048 | 8/2017 |

\* cited by examiner

LIGHT EMITTING DEVICE

CROSS-REFERENCE TO RELATED APPLICATION

This application claims the benefit of U.S. Provisional Patent Application No. 62/756,935, filed on Nov. 7, 2018, which is hereby incorporated by reference for all purposes as if fully set forth herein.

BACKGROUND

Field

Exemplary embodiments of the invention relate generally to a light emitting device, and more specifically, to a light emitting device including a plurality of light emitting parts.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and faster response speed than existing light sources.

Recently, as light emitting diodes are being developed toward light weight, thin thickness, compactness, and miniaturization to be used as backlight sources of various display devices, such as a mobile phone, a color mixing may occur between neighboring light emitting cells.

The above information disclosed in this Background section is only for understanding of the background of the inventive concepts, and, therefore, it may contain information that does not constitute prior art.

SUMMARY

Devices constructed according to exemplary embodiments of the invention are capable of improving light efficiency and light extraction.

Additional features of the inventive concepts will be set forth in the description which follows, and in part will be apparent from the description, or may be learned by practice of the inventive concepts.

A light emitting device according to an exemplary embodiment includes a substrate having a first surface and a second surface opposing the first surface, a light emitting structure disposed on the first surface of the substrate and defining a light emitting area, and a first light shielding layer disposed on the second surface of the substrate and exposing at least a portion of the light emitting area, in which the second surface of the substrate has a rough surface that overlaps at least a portion the light emitting area.

A thickness of a portion of the substrate including the rough surface may be less than a thickness of a portion of the substrate not formed with the rough surface.

The second surface of the substrate may include a sidewall connected to the rough surface, and the first light shielding layer may extend to the sidewall of the substrate, at least partially cover the rough surface, and define a light extraction surface of the light emitting structure.

The light extraction surface may have a width less than that of the rough surface and that of the light emitting area.

The rough surface may include a convex and concave pattern, and a roughness of a portion of the convex and concave pattern formed in the light extraction surface may be different from that of a portion of the convex and concave pattern covered by the first light shielding layer.

The first light shielding layer may have substantially the same width along the sidewall of the substrate.

The sidewall of the substrate may be inclined with a predetermined slope, and the first light shielding layer may have a width that gradually decreases from the second surface of the substrate toward an inside of the substrate, and have a side surface vertically extending from the second surface of the substrate.

The rough surface may be disposed within the light emitting area, and have a width less than the light emitting area.

The rough surface may cover the light emitting area, and have a width equal to or greater than the light emitting area.

The light emitting device may further include a second light shielding layer disposed on the first surface of the substrate and surrounding an outer side of the light emitting structure.

The first surface of the substrate may have a convex part in the light emitting area and a concave part in an area excluding the light emitting area.

The light emitting device may further include a second light shielding layer disposed in the concave part of the substrate and surrounding an outer side of the light emitting structure.

A portion of the second light shielding layer disposed in the concave part and a portion of the first light shielding layer covering at least a portion of the rough surface of the substrate may overlap with each other.

The rough surface may include a plurality of first holes, and at least a portion of the first holes may be disposed in the light emitting area.

The first light shielding layer may be disposed in the first holes, extend along the second surface of the substrate to cover at least a portion of the light emitting area, and define a light extraction surface of the light emitting structure.

The light extraction surface may have a width less than that of the light emitting area.

The first holes formed in the light extraction surface may be filled with air.

The first holes formed in the light extraction surface may be filled with the first light shielding layer.

The light emitting device may further include a second light shielding layer disposed on the first surface of the substrate and surrounding an outer side of the light emitting structure.

The first surface of the substrate may include a plurality of second holes, and the second light shielding layer may be disposed in at least a portion of the second holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
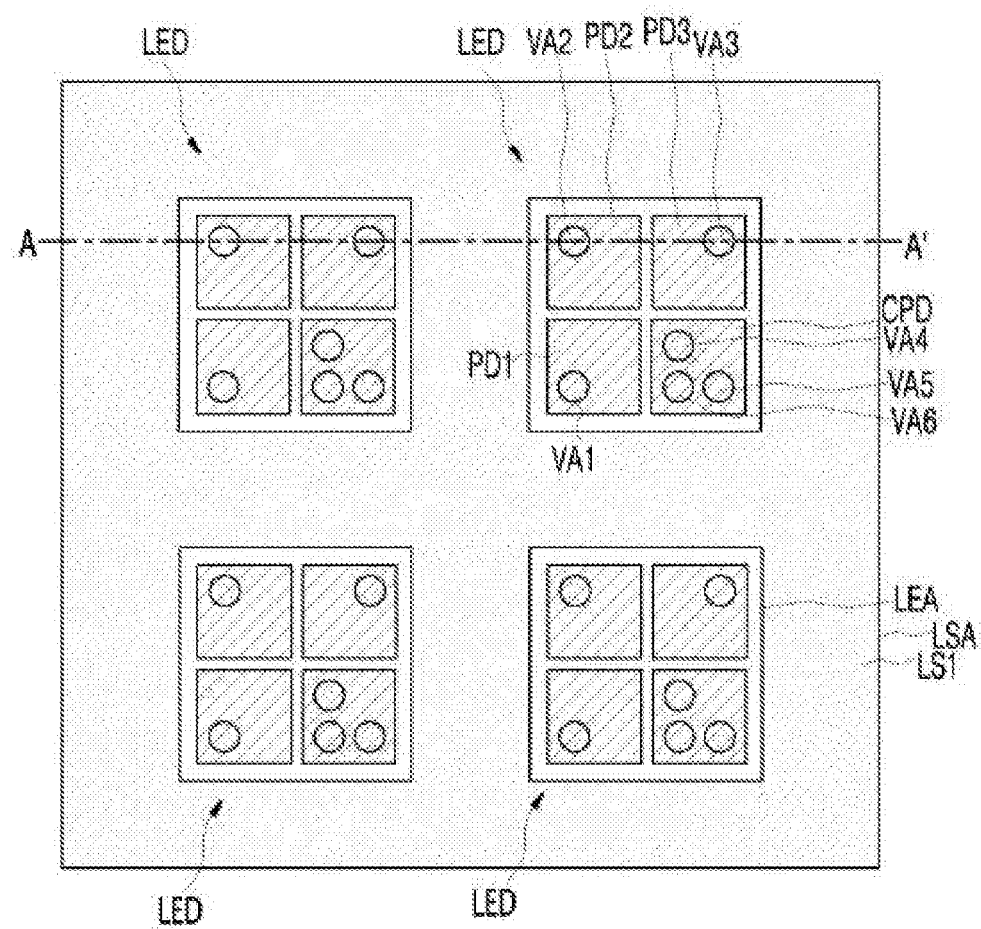
FIGS. 1A and 1B are top views of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
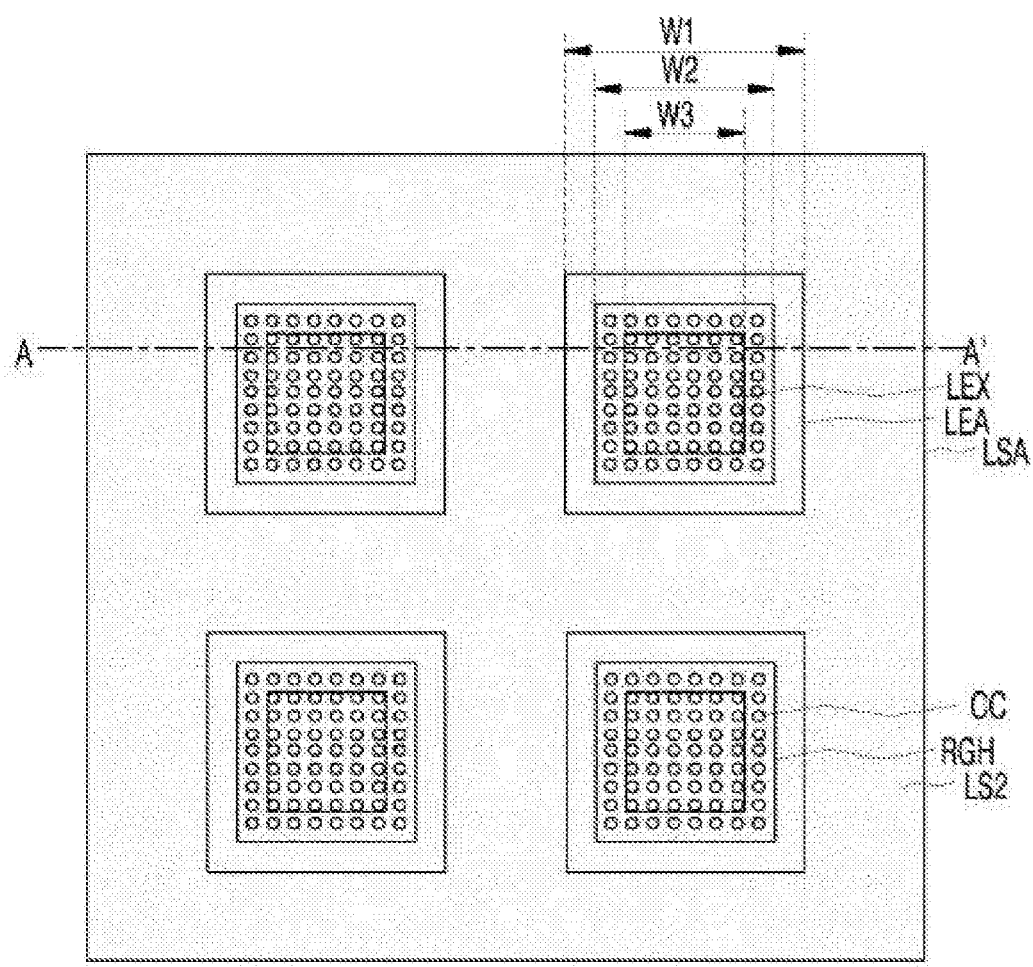
Figure 1C:
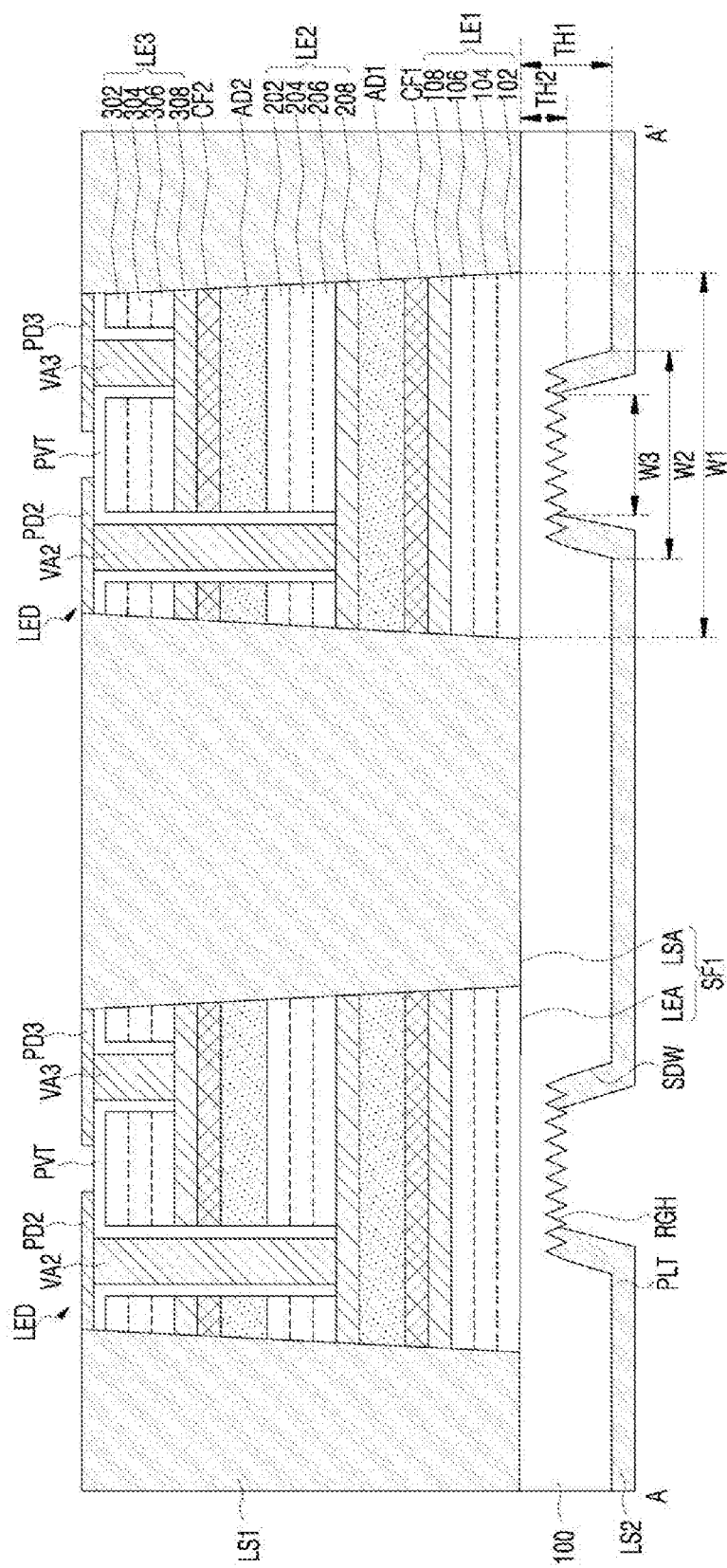
FIGS. 1C, 1D, and 1E are cross-sectional views taken along line A-A' of FIG. 1A according to exemplary embodiments.
Figure 1D:
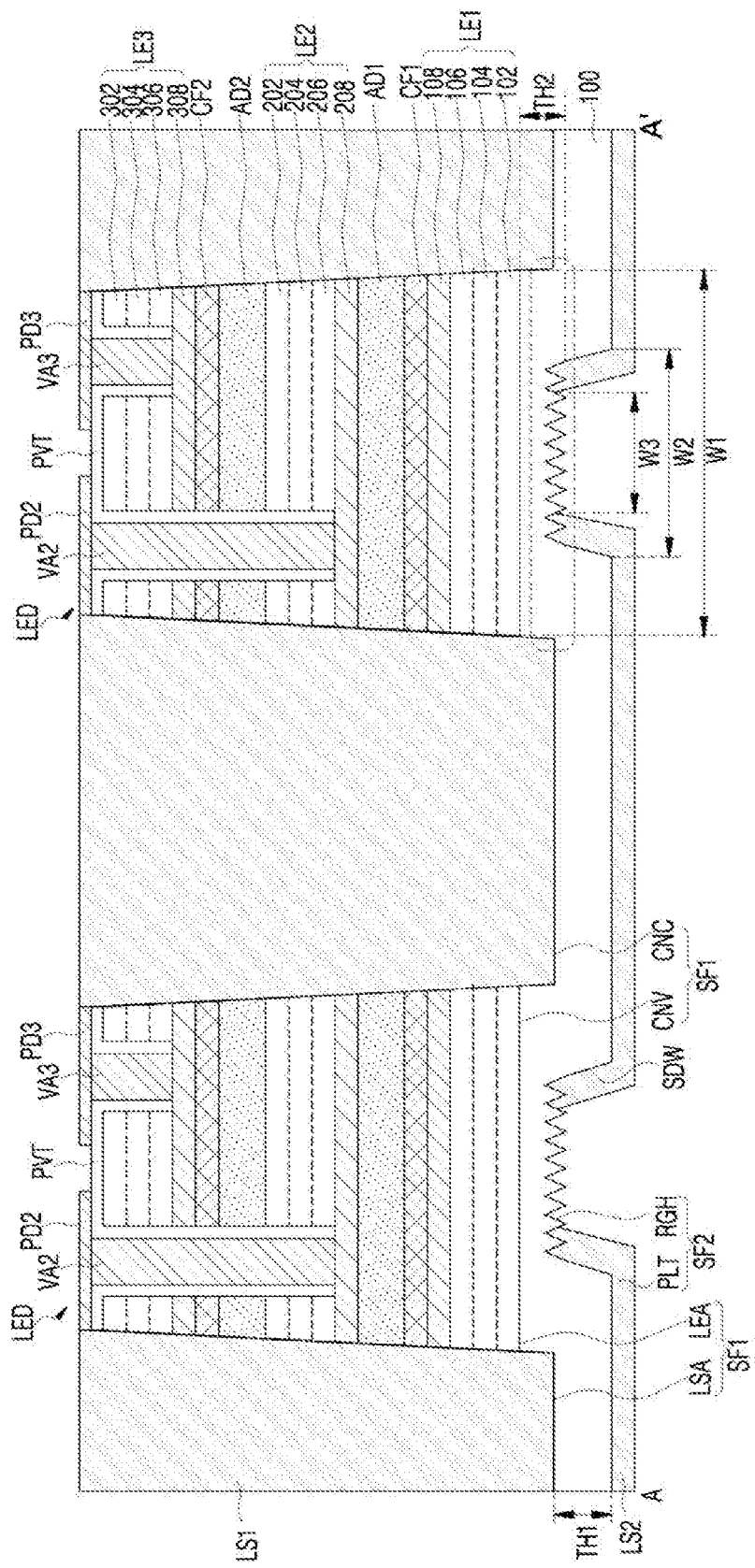
Figure 1E:
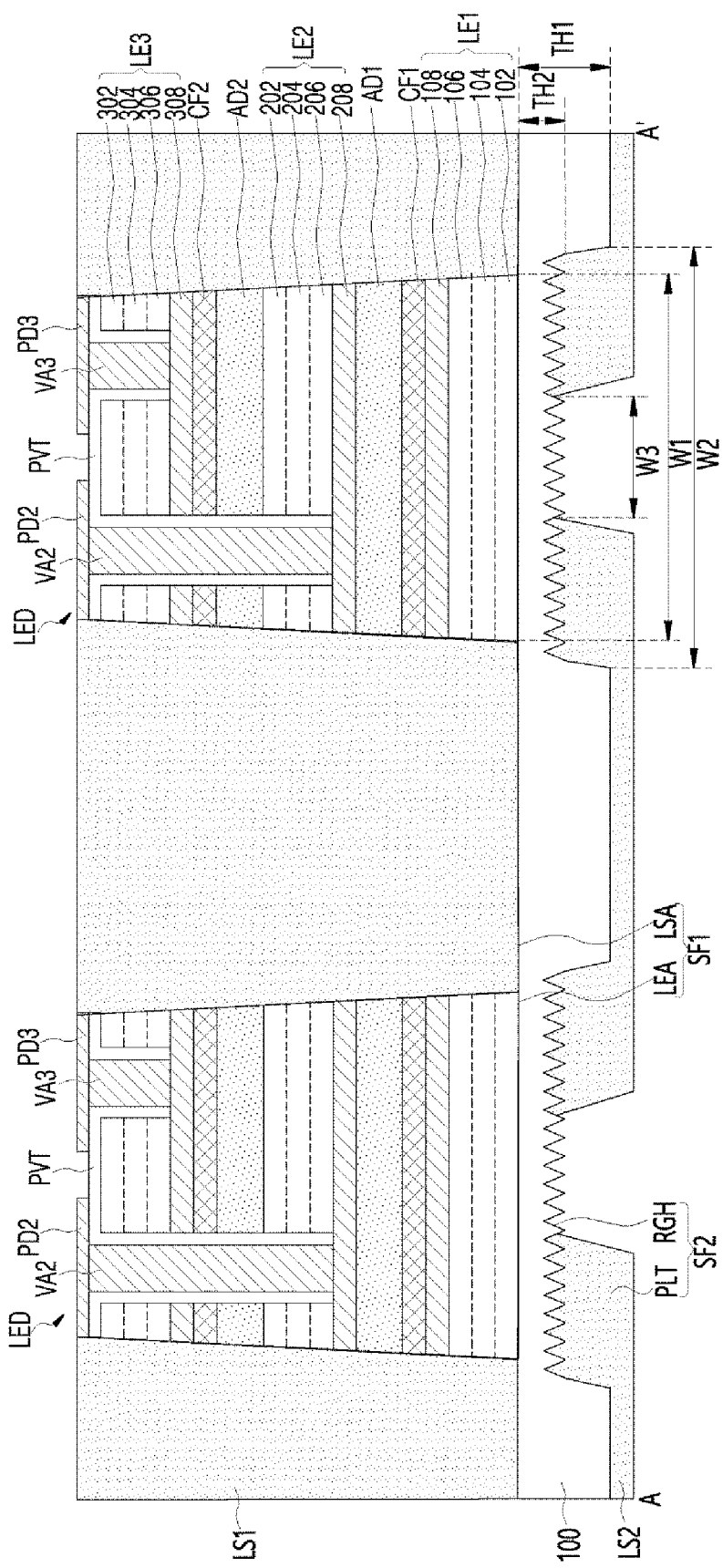
Figure 2A:
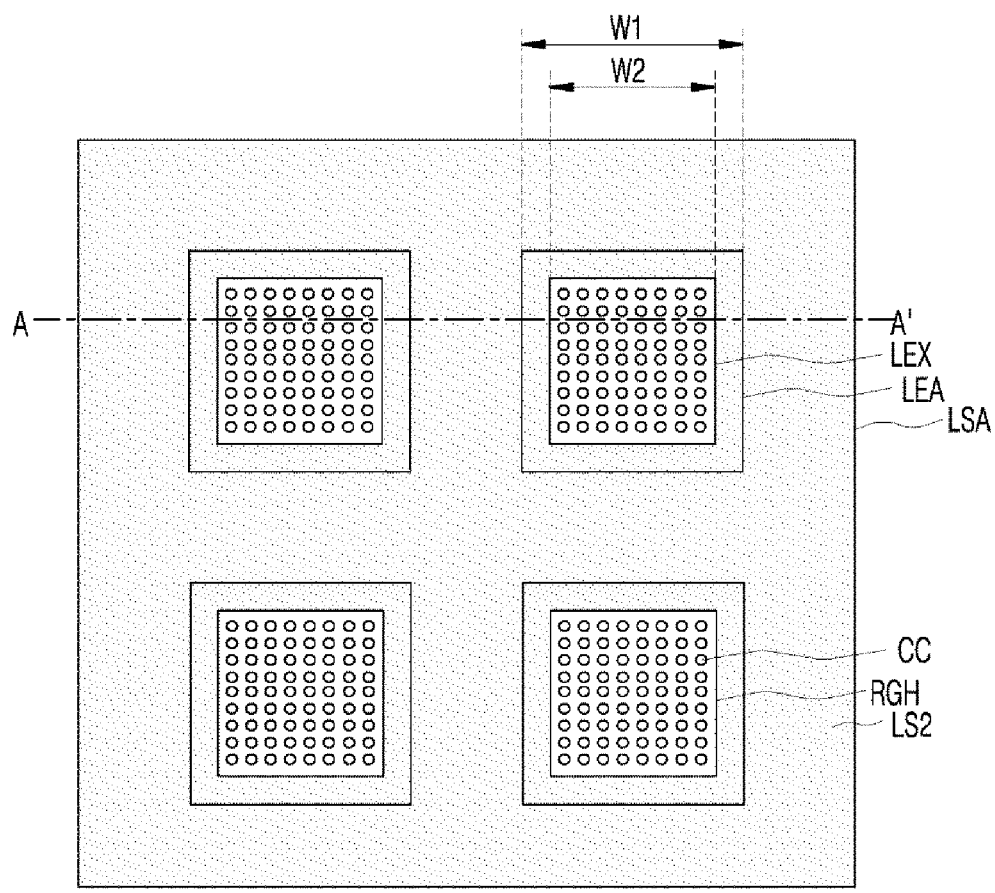
FIG. 2A is a top view of a light emitting device according to another exemplary embodiment.
Figure 2B:
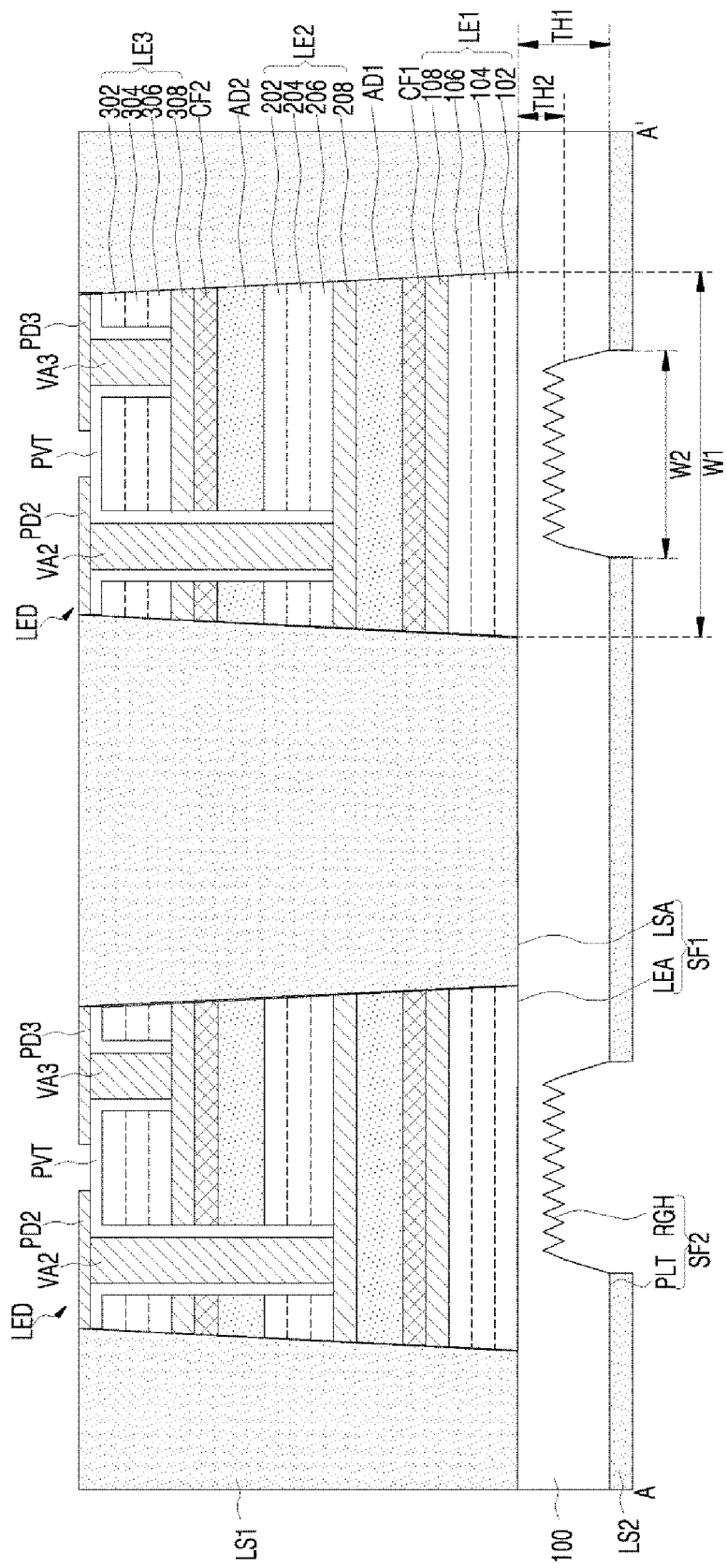
FIG. 2B is a cross-sectional view taken along line A-A' of FIG. 2A.
Figure 3A:
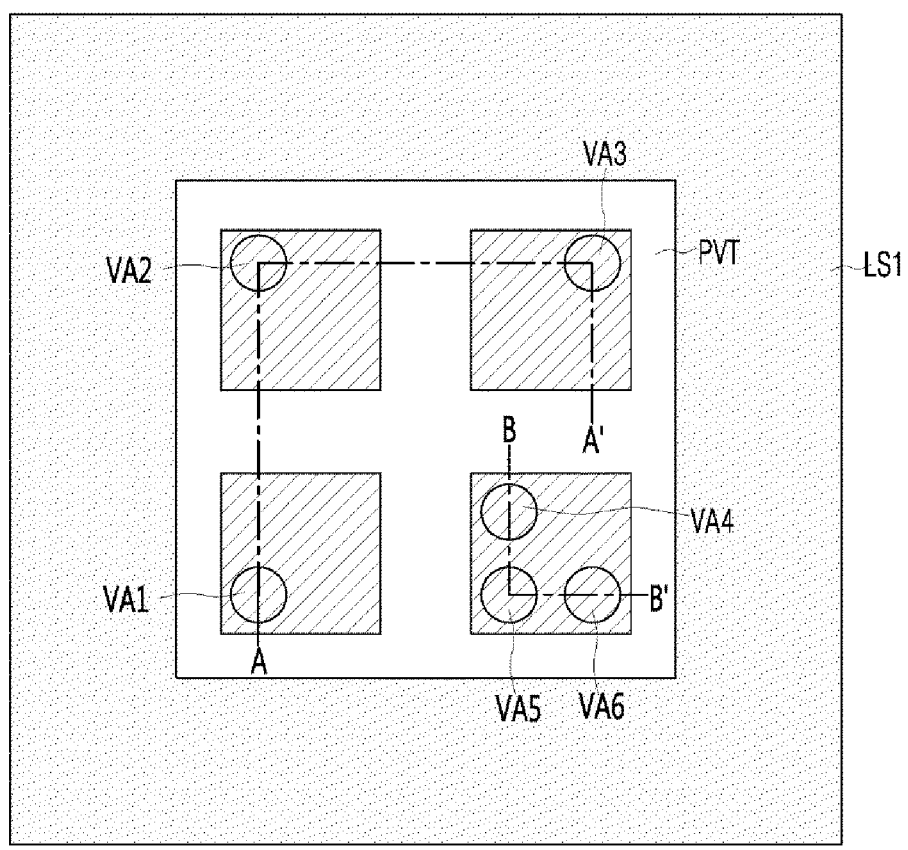
FIG. 3A is a top view of a light emitting structure according to an exemplary embodiment.
Figure 3B:
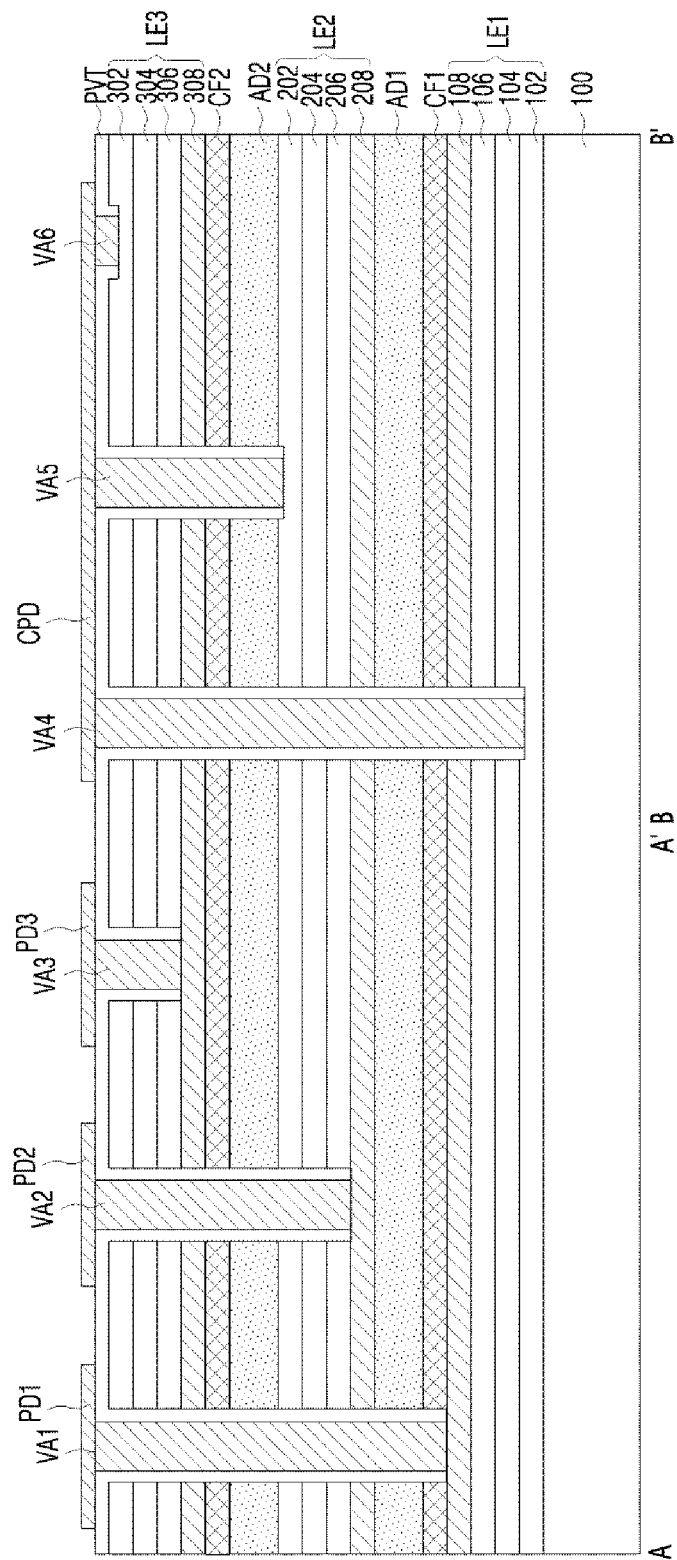
FIG. 3B is a cross-sectional view taken along lines A-A' and B-B' of FIG. 3A.

FIGS. 1A and 1B are top views of a light emitting device according to an exemplary embodiment, and FIGS. 1C, 1D, and 1E are cross-sectional views taken along line A-A' of FIG. 1A according to exemplary embodiments. FIG. 2A is a top view of a light emitting device according to another exemplary embodiment, and FIG. 2B is a cross-sectional view taken along line A-A' of FIG. 2A. FIG. 3A is a cross-sectional view of a light emitting structure according to an exemplary embodiment, and FIG. 3B is a cross-sectional view taken along lines A-A' and B-B' of FIG. 3A. FIGS. 4A, 4B, 5A, and 5B are cross-sectional views of the structures of rough surfaces and second light shielding layers according to exemplary embodiments.

Referring to FIGS. 1A to 3B, a light emitting device may include a substrate 100 and light emitting structures LED, each including a first light emitting part LE1, a second light emitting part LE2, and a third light emitting part LE3 stacked on the substrate 100.

FIG. 1A is a plan view of the light emitting device when viewed from the third light emitting part LE3, and FIG. 1B is a plan view of the light emitting device when viewed from the substrate 100. FIG. 2A is a plan view of the light emitting device when viewed from the substrate 100. FIGS. 3A and 3B are enlarged views of a light emitting structure.

The substrate 100 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), or silicon. Also, the substrate 100 may be a patterned sapphire substrate. According to an exemplary embodiment, the substrate 100 may include a material that transmits visible light.

The substrate 100 may have a first surface SF1 and a second surface SF2 opposing the first surface SF1. A plurality of light emitting structures LED may be disposed on the first surface SF1 of the substrate 100 and be spaced apart from each other. Hereinafter, an area in which each light emitting structure LED is disposed is referred to as a light emitting area LEA, and the remaining area in which the light emitting structures LED are not disposed is referred to as a light shielding area LSA.

Referring to FIGS. 1A, 1C, 1E, and 2A, the first surface SF1 of the substrate 100 according to exemplary embodiments may be substantially flat. Referring to FIG. 1D, the first surface SF1 of the substrate 100 according to another exemplary embodiment may have a convex part CNV in each light emitting area LEA, and may have a concave part CNC in the light shielding area LSA. A top surface of each convex part CNV of the first surface SF1 may be disposed at a higher level than a top surface of the concave part CNC. As such, the first surface SF1 may be formed with a stepped part between the convex part CNV and the concave part CNC.

Referring to FIGS. 1A to 2B, the second surface SF2 of the substrate 100 may include rough surfaces RGH, each having a convex and concave pattern CC, and a flat surface PLT. Each rough surface RGH may overlap with at least a portion of each light emitting area LEA disposed on the first surface SF1 of the substrate 100.

Referring to FIGS. 1B, 1C, 1D, 2A, and 2B, each light emitting area LEA may have a first width W1, and each rough surface RGH may have a second width W2 less than the first width W1. The center of each light emitting area LEA may be concentric with the center of each rough surface RGH. Referring to FIG. 1E each light emitting area LEA according to another exemplary embodiment may have a first width W1, and each rough surface RGH may have a second width W2 equal to or greater than the first width W1. The center of each light emitting area LEA may be concentric with the center of each rough surface RGH.

In this manner, since the second surface SF2 of the substrate 100 has the rough surfaces RGH, light generated from light emitting areas LEA may be diffusively reflected through the rough surfaces RGH, which may improve the light extraction efficiency of the light emitting device.

As shown in FIGS. 1C, 1D, 1E, and 2B, when the first surface SF1 of the substrate 100 is substantially flat and the second surface SF2 has the rough surfaces RGH and the flat surface PLT, the substrate 100 may have a first thickness TH1 in a portion of the flat surface PLT of the second surface SF2 of the substrate 100, and a second thickness TH2 less than the first thickness TH1 in a portion of the second surface SF2 of the substrate 100 where the rough surfaces RGH are formed. Due to a thickness difference in the substrate 100, sidewalls SDW of the substrate 100 may be defined by the ends of the rough surfaces RGH. According to another exemplary embodiment shown in FIG. 1D, when the first surface SF1 of the substrate 100 has convex parts CNV and the concave part CNC, and the second surface SF2 has the rough surfaces RGH and the flat surface PLT, the rough surfaces RGH may correspond to the convex parts CNV and overlap with at least portions of the convex parts CNV. The substrate 100 may have a first thickness TH1 between the concave part CNC of the first surface SF1 and the flat surface PLT of the second surface SF2 of the substrate 100, and may have a second thickness TH2 less than the first thickness TH1 between the convex part CNV of the first surface SF1 and the rough surface RGH of the second surface SF2 of the substrate 100.

In this manner, since the thickness of the substrate 100 is formed relatively thin in a region where the rough surface RGH is formed, a distance through which light travels through the substrate 100 may be decreased. As such, the light emitting structure LED according to exemplary embodiments may reduce an amount of light lost in the substrate 100. Further, since the thickness of the substrate 100 is relatively thick in a region where the flat surface PLT is formed, the substrate 100 may support the light emitting structure LED and may prevent the substrate 100 from being damaged from an external shock.

According to an exemplary embodiment, the convex and concave pattern CC of the rough surface RGH may have the same shape and may be arranged regularly. However, the inventive concepts are not limited thereto, and in some exemplary embodiments, the convex and concave pattern CC of the rough surface RGH may have different shapes and/or may be arranged irregularly.

For example, each sidewall SDW of the substrate 100, which is defined by the rough surface RGH formed on the second surface SF2 of the substrate 100, may have a slope. As such, the space defined between the sidewalls SDW of the substrate 100 may have a width that gradually narrows from the second surface SF2 toward the inside of the space. As another example, each sidewall SDW of the substrate 100 may be vertical.

Referring to FIGS. 1A to 3B, when the second surface SF2 of the substrate 100 is a light extraction surface, the wavelength of light emitted from the first light emitting part LE1 may be the shortest, the wavelength of light emitted from the second light emitting part LE2 may be longer than the wavelength of light emitted from the first light emitting part LE1 and be shorter than the wavelength of light emitted from the third light emitting part LE3, and the wavelength of light emitted from the third light emitting part LE3 may be the longest. For example, the first light emitting part LE1 may emit blue light, the second light emitting part LE2 may emit green light, and the third light emitting part LE3 may emit red light. However, the inventive concepts are not limited thereto. For example, in some exemplary embodiments, the second light emitting part LE2 may emit light having a shorter wavelength than light emitted from the first light emitting part LE1.

Referring to FIGS. 3A and 3B, the first light emitting part LE1 may include a first n-type semiconductor layer 102, a first active layer 104, a first p-type semiconductor layer 106, and a first ohmic layer 108, the second light emitting part LE2 may include a second n-type semiconductor layer 202, a second active layer 204, a second p-type semiconductor layer 206, and a second ohmic layer 208, and the third light emitting part LE3 may include a third n-type semiconductor layer 302, a third active layer 304, a third p-type semiconductor layer 306, and a third ohmic layer 308.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first ohmic layer 108, the second ohmic layer 208, and the third ohmic layer 308, a transparent conductive oxide (TCO), such as a tin oxide (SnO), an indium oxide ($InO_2$), a zinc oxide (ZnO), an indium tin oxide (ITO), or indium tin zinc oxide (ITZO) may be used.

The first light emitting part LE1 may be spaced apart from the second light emitting part LE2. For example, the first ohmic layer 108 of the first light emitting part LE1 may face the second ohmic layer 208 of the second light emitting part LE2. As another example, the first ohmic layer 108 of the first light emitting part LE1 may face the second n-type semiconductor layer 202 of the second light emitting part LE2.

The second light emitting part LE2 may be spaced apart from the third light emitting part LE3. For example, the second ohmic layer 208 of the second light emitting part LE2 may face the third ohmic layer 308 of the third light emitting part LE3. As another example, the second ohmic layer 208 of the second light emitting part LE2 may face the third n-type semiconductor layer 302 of the third light emitting part LE3.

The light emitting device may further include a first adhesion part AD1 disposed between the first light emitting part LE1 and the second light emitting part LE2 to bond the first light emitting part LE1 and the second light emitting part LE2, and a second adhesion part AD2 disposed between the second light emitting part LE2 and the third light emitting part LE3 to bond the second light emitting part LE2 and the third light emitting part LE3. Each of the first adhesion part AD1 and the second adhesion part AD2 may include a material that transmits visible light and has an insulating property. Each of the first adhesion part AD1 and the second adhesion part AD2 may include a polymer, a resist, or a polyimide. For example, each of the first adhesion part AD1 and the second adhesion part AD2 may include at least one of SOG (spin-on-glass), BCB (benzo cyclo butadiene), HSQ (hydrogen silsesquioxanes), an SU-8 photoresist, epoxy, PAE (poly arylene ether), such as Flare™, MSSQ (methylsilsesquioxane), PMMA (polymethylmethacrylate), PDMS (polydimethylsiloxane), fluoropolymer, polyimide, MSSQ (methylsilisequioxane), PEEK (polyethereherketone), ATSP (Aromatic Thermosetting Polyester), PVDC (Polyvinylidene chloride), LCP (liquid-crystal polymer), or wax.

The light emitting device may further include a first color filter CF1 disposed between the first light emitting part LE1 and the second light emitting part LE2, and a second color filter CF2 disposed between the second light emitting part LE2 and the third light emitting part LE3. The first color filter CF1 may be disposed on the first ohmic layer 108 of the first light emitting part LE1 or the second ohmic layer 208 of the second light emitting part LE2. The second color filter CF2 may be disposed on the second n-type semiconductor layer 202 of the second light emitting part LE2 or the third ohmic layer 308 of the third light emitting part LE3. The first color filter CF1 may reflect light emitted from the first light emitting part LE1 and pass light emitted from the second light emitting part LE2 and the third light emitting part LE3, so that light emitted from the first light emitting part LE1 does not exert an influence on each of the second light emitting part LE2 and the third light emitting part LE3. The second color filter CF2 may reflect light emitted from the first light emitting part LE1 and the second light emitting part LE2 and pass light emitted from the third light emitting part LE3, so that light emitted from the first light emitting part LE1 and the second light emitting part LE2 does not exert an influence on the third light emitting part LE3. Each of the first color filter CF1 and the second color filter CF2 may include a DBR (distributed Bragg reflector), in which $TiO_2$ and $SiO_2$ are alternately stacked. The first color filter CF1 may be different from the second color filter CF2 in terms of the alternation number and thickness of $TiO_2$ and $SiO_2$. In some exemplary embodiments, at least one of the first color filter CF1 and the second color filter CF2 may be selectively omitted.

The light emitting device may further include a first pad PD1 electrically coupled with the first ohmic layer 108, a second pad PD2 electrically coupled with the second ohmic layer 208, a third pad PD3 electrically coupled with the third ohmic layer 308, and a common pad CPD electrically coupled in common with the first n-type semiconductor layer 102, the second n-type semiconductor layer 202, and the third n-type semiconductor layer 302. Referring to FIG. 3A, when viewed from the top, the substrate 100 may have a substantially quadrangular structure, and the first pad PD1, the second pad PD2, the third pad PD3, and the common pad CPD may be disposed at the respective corners of the substrate 100.

While the first n-type semiconductor layer 102, the second n-type semiconductor layer 202, and the third n-type semiconductor layer 302 are illustrated as being coupled to the common pad CPD, however, the inventive concepts are not limited thereto. For example, in some exemplary embodiments, the first ohmic layer 108, the second ohmic layer 208, and the third ohmic layer 308 may be coupled to the common pad CPD.

Referring to FIGS. 3A and 3B, the light emitting device may further include a first via pattern VA1, which passes through the third light emitting part LE3, the second color filter CF2, the second adhesion part AD2, the second light emitting part LE2, the first adhesion part AD1, and the first color filter CF1 and electrically couples the first ohmic layer 108 and the first pad PD1, a second via pattern VA2, which passes through the third light emitting part LE3, the second color filter CF2, the second adhesion part AD2, the second n-type semiconductor layer 202, the second active layer 204, and the second p-type semiconductor layer 206 and electrically couples the second ohmic layer 208 and the second pad PD2, and a third via pattern VA3, which passes through the third n-type semiconductor layer 302, the third active layer 304, and the third p-type semiconductor layer 306 and electrically couples the third ohmic layer 308 and the third pad PD3. Also, the light emitting device may further include a fourth via pattern VA4, which passes through the third light emitting part LE3, the second color filter CF2, the second adhesion part AD2, the second light emitting part LE2, the first adhesion part AD1, the first color filter CF1, the first ohmic layer 108, the first p-type semiconductor layer 106, and the first active layer 104 and electrically couples the first n-type semiconductor layer 102 and the common pad CPD, a fifth via pattern VA5, which passes through the third light emitting part LE3, the second color filter CF2, and the second adhesion part AD2 and electrically couples the second n-type semiconductor layer 202 and the common pad CPD, and a sixth via pattern VA6, which passes through a portion of the third n-type semiconductor layer 302 and electrically couples the third n-type semiconductor layer 302 and the common pad CPD. In some exemplary embodiments, the sixth via pattern VA6 may be omitted.

While the light emitting structure LED according to the illustrated exemplary embodiment is illustrated as including the first light emitting part LE1, the second light emitting part LE2, and the third light emitting part LE3, which are vertically stacked, and that the light emitting device includes the via patterns VA1, VA2, VA3, VA4, VA5, and VA6 passing through the first light emitting part LE1, the second light emitting part LE2, and the third light emitting part LE3, however, the inventive concepts are not limited thereto. For example, according to another exemplary embodiments, by etching the vertically stacked first light emitting part LE1, the second light emitting part LE2, and the third light emitting part LE3, the light emitting device may have a structure, which exposes the first n-type semiconductor layer 102, the second n-type semiconductor layer 202, the third n-type semiconductor layer 302, the first ohmic layer 108, the second ohmic layer 208, and the third ohmic layer 308. According to still another exemplary embodiment, the light emitting device may have a structure, in which the first light emitting part LE1, the second light emitting part LE2, and the third light emitting part LE3 are horizontally disposed on the same plane. In some exemplary embodiments, the light emitting device may have one light emitting part.

Referring to FIGS. 1A to 3B, the light emitting device may further include a first light shielding layer LS1, which surrounds the outer sidewall of each light emitting structure LED on the first surface SF1 of the substrate 100 and substantially fills between neighboring light emitting structures LED. The first light shielding layer LS1 may include a material that may shield, absorb, or reflect light generated from each light emitting structure LED and have an insulating property, such that light generated from each light emitting structure LED is not mixed with that from a neighboring light emitting structure LED. For example, the first light shielding layer LS1 may include a material, such as a photoresist, epoxy, PDMS (polydimethylsiloxane), and a black matrix.

The light emitting device may further include a second light shielding layer LS2 having openings that expose at least portions of the rough surfaces RGH on the second surface SF2 of the substrate 100. Each rough surface RGH exposed by the opening in the second light shielding layer LS2 may be a light extraction surface LEX. The second light shielding layer LS2 may include metal, such as Ti, Ni, Al, Ag, and Cr, or may include a material, such as a photoresist, epoxy, PDMS, and a black matrix.

The light extraction surface LEX according to the illustrated exemplary embodiments is shown as having a quadrangular structure, when viewed from the top as in FIGS. 1B and 2A. However, the inventive concepts are not limited thereto, and in some exemplary embodiments, the light extraction surface LEX may have a substantially polygonal shape, such as substantially a triangular or a circular shape.

Referring back to FIGS. 2A and 2B, the second light shielding layer LS2 according to the illustrated exemplary embodiment may be disposed on the second surface SF2 of the substrate 100 while exposing the rough surfaces RGH and not being formed on the sidewalls SDW of the substrate 100. More particularly, the second light shielding layer LS2 may not cover the rough surfaces RGH.

Referring back to FIGS. 1B to 1E, the second light shielding layer LS2 according to the illustrated exemplary embodiment may extend from the second surface SF2 of the substrate 100 to the sidewalls SDW of the substrate 100, and cover the ends of the rough surfaces RGH. The openings of the second light shielding layer LS2 may expose portions of the rough surfaces RGH. The centers of the openings may be concentric with the centers of the rough surfaces RGH. Each rough surface RGH exposed by each opening of the second light shielding layer LS2 may be the light extraction surface LEX.

Figure 4A:
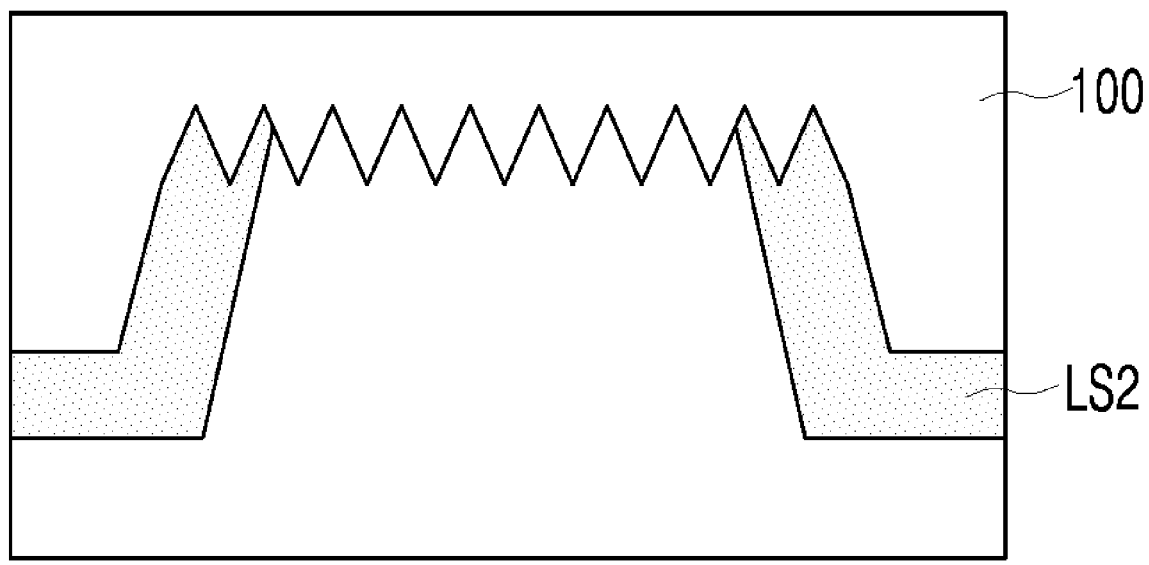
FIGS. 4A, 4B, 5A, and 5B are cross-sectional views of the structures of rough surfaces and second light shielding layers according to exemplary embodiments.
Figure 4B:
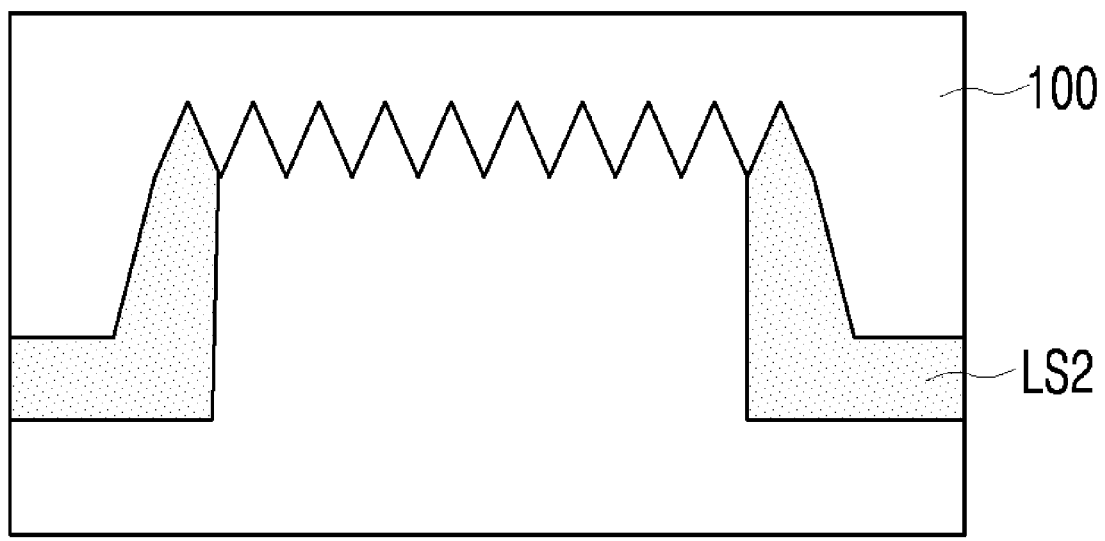

Referring to FIG. 4A, the second light shielding layer LS2 according to an exemplary embodiment may have substantially the same thickness on each sidewall SDW of the substrate 100, and may have a sloped side surface on each side of the substrate 100. Referring to FIG. 4B, the second light shielding layer LS2 according to another exemplary embodiment may have a thickness that gradually decreases from the second surface SF2 of the substrate 100 toward the inside of the substrate 100 on each sidewall SDW of the substrate 100, such that vertical side surface may be formed on each sidewall SDW of the substrate 100.

Referring back to FIG. 1D, the first light shielding layer LS1, which is disposed on the concave part CNC of the first surface SF1 of the substrate 100, and the second light shielding layer LS2, which covers the sidewalls SDW of the substrate 100 defined by the rough surfaces RGH, may have an area that overlap with each other. The overlapping area between the first light shielding layer LS1 and the second light shielding layer LS2 may prevent light from being mixed between neighboring light emitting structures LED.

Referring to FIG. 1E, the second width W2 of each rough surface RGH may be equal to or greater than the first width W1 of the light emitting area LEA, and the second light shielding layer LS2 may cover each rough surface RGH relatively thick to expose the light extraction surface LEX at a third width W3 less that the second width W2 of the light emitting area LEA. Light generated from neighboring light emitting structures LED may be vanished by being diffusively reflected by the convex and concave pattern CC of the rough surface RGH, which are covered by the second light shielding layer LS2, and the remaining light that has not been vanished may be absorbed, shielded, and reflected by the second light shielding layer LS2, so as to prevent a color mixing.

In addition, in each rough surface RGH, the convex and concave pattern CC of the rough surface RGH that are covered by the second light shielding layer LS2 may have a first roughness, and the convex and concave pattern CC of the rough surface RGH exposed by each opening of the second light shielding layer LS2 may have a second roughness different from the first roughness. For example, referring to FIG. 5A, the first roughness may be greater than the second roughness. As another example, referring to FIG. 5B, the first roughness may be less than the second roughness.

In this manner, light generated from the light emitting structure LED may be emitted through an area reduced by the second light shielding layer LS2. As such, the contrast of light emitting device may be increased, whereby color reproducibility may be improved. Further, the second light shielding layer LS2 together with the first light shielding layer LS1 may prevent light generated from neighboring light emitting structures LED from being mixed, which may prevent a color mixing.

Figure 6A:
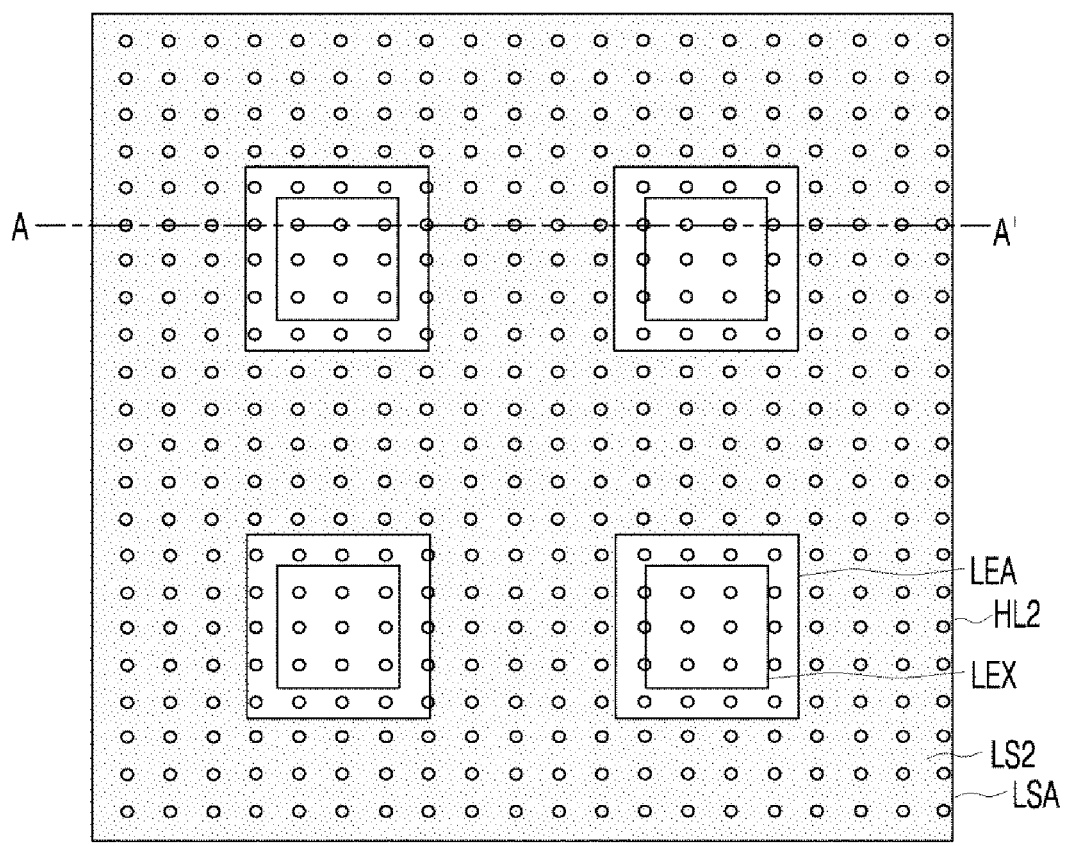
FIG. 6A is a top view of a light emitting device according to another exemplary embodiment.
Figure 6B:
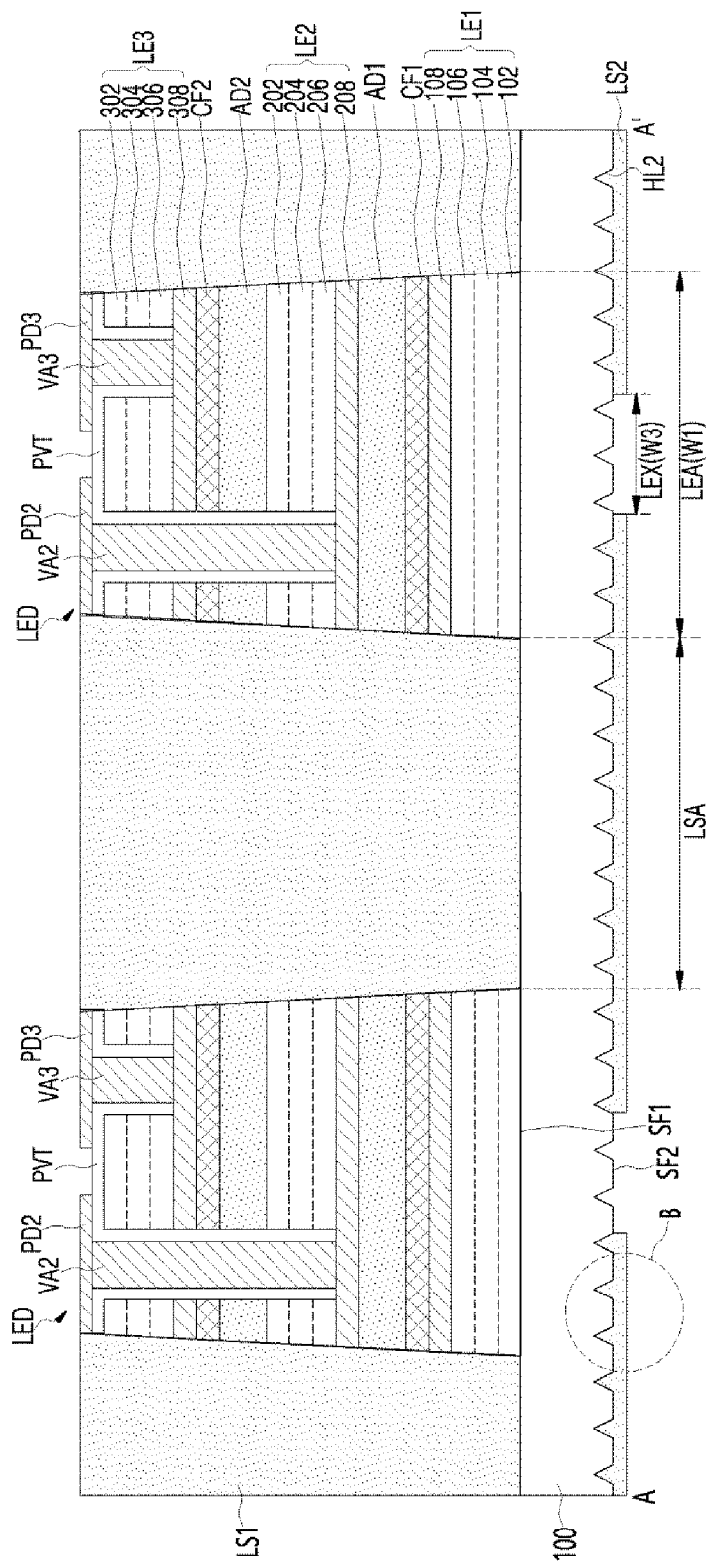
FIG. 6B is a cross-sectional view taken along line A-A' of FIG. 6A.
Figure 7A:
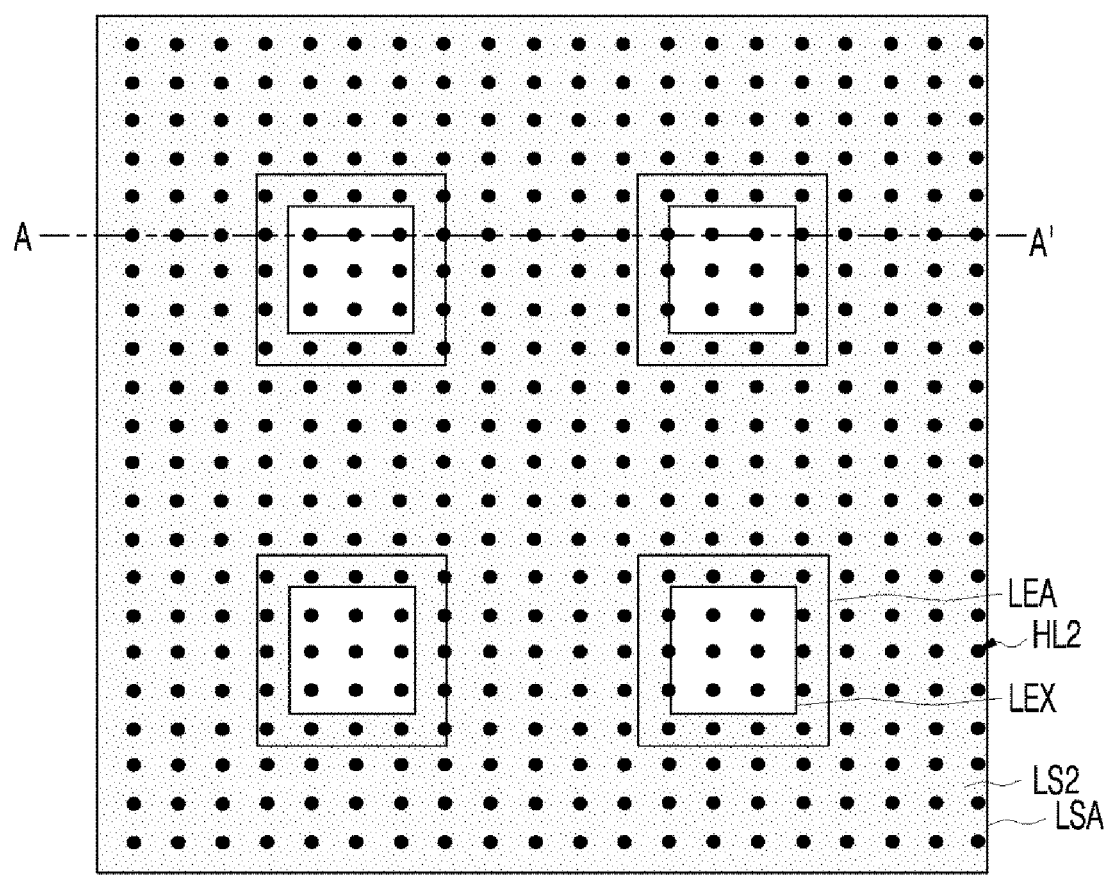
FIG. 7A is a top view of a light emitting device according to yet another exemplary embodiment.
Figure 7B:
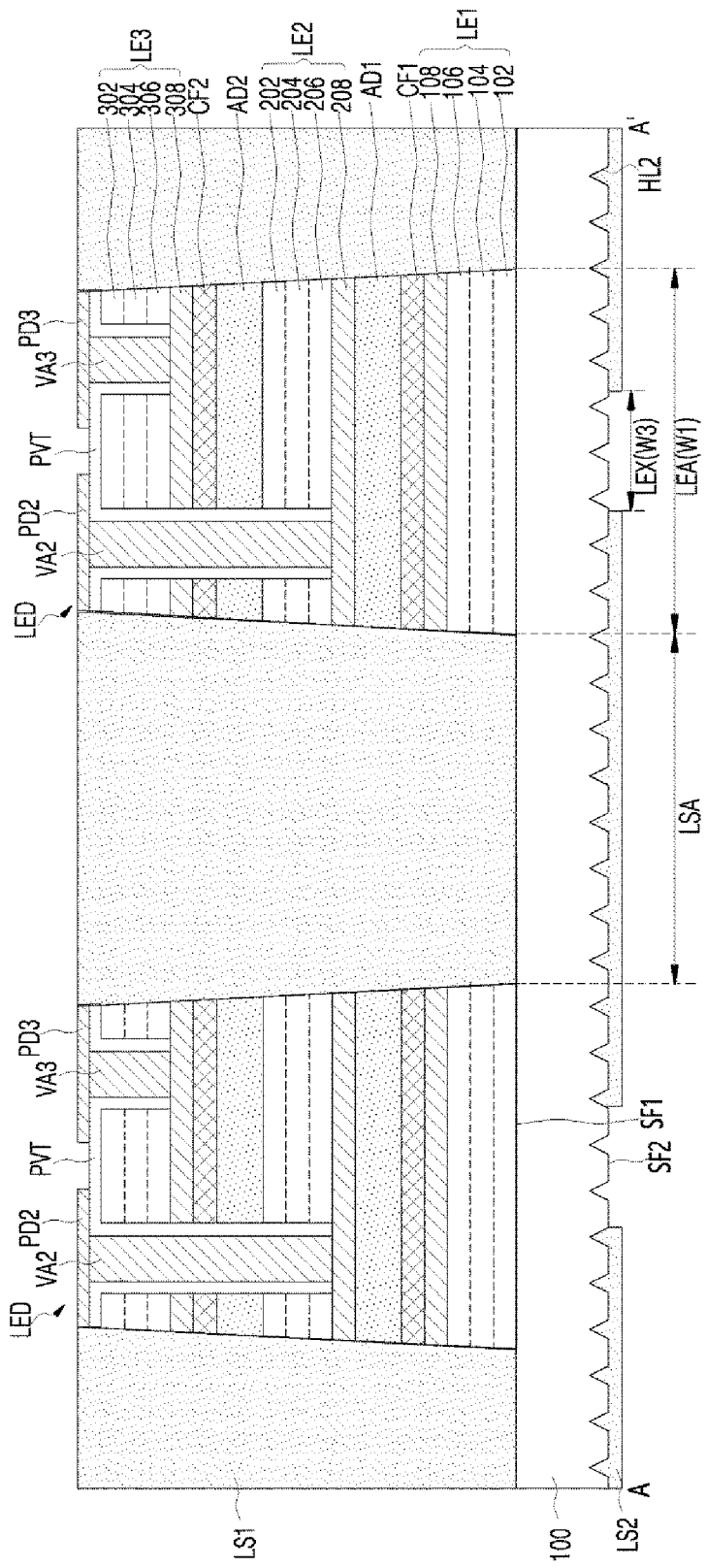
FIGS. 7B and 7C are cross-sectional views taken along line A-A' of FIG. 7A according to exemplary embodiments.
Figure 7C:
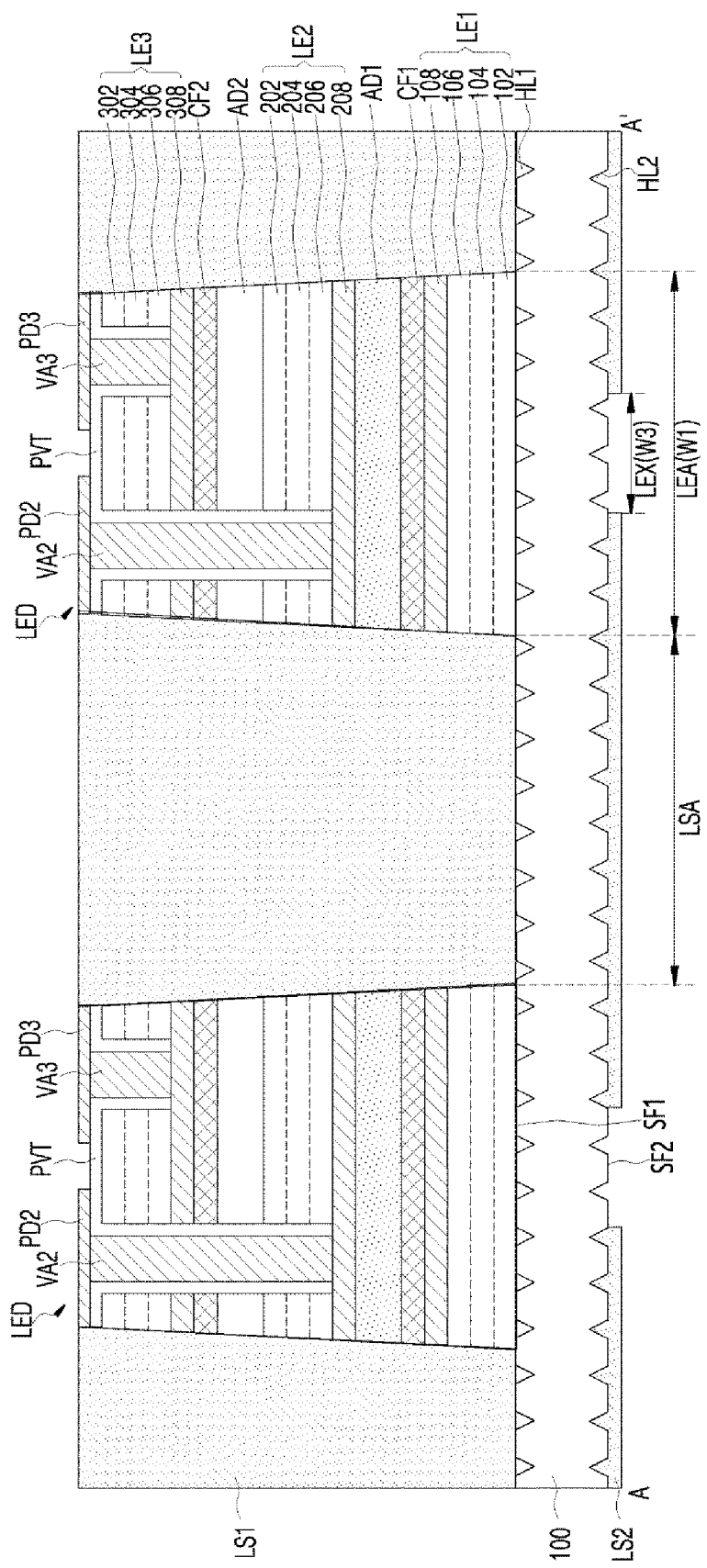
Figure 8A:
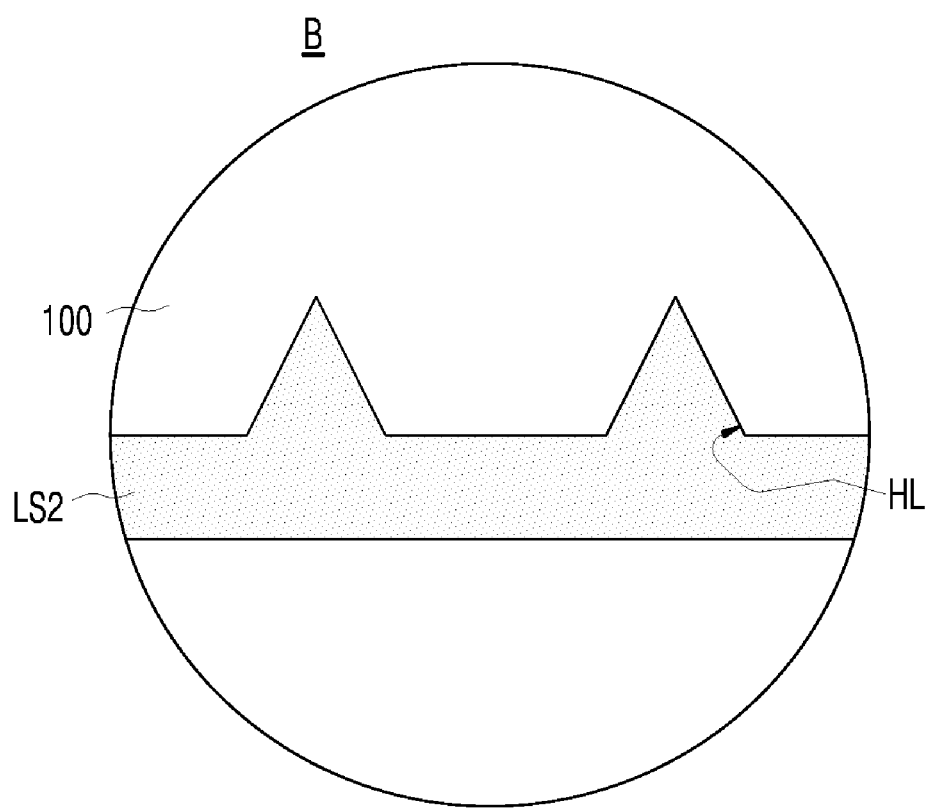
FIGS. 8A and 8B are enlarged views for the part B of the light emitting device of FIG. 6A.
Figure 8B:
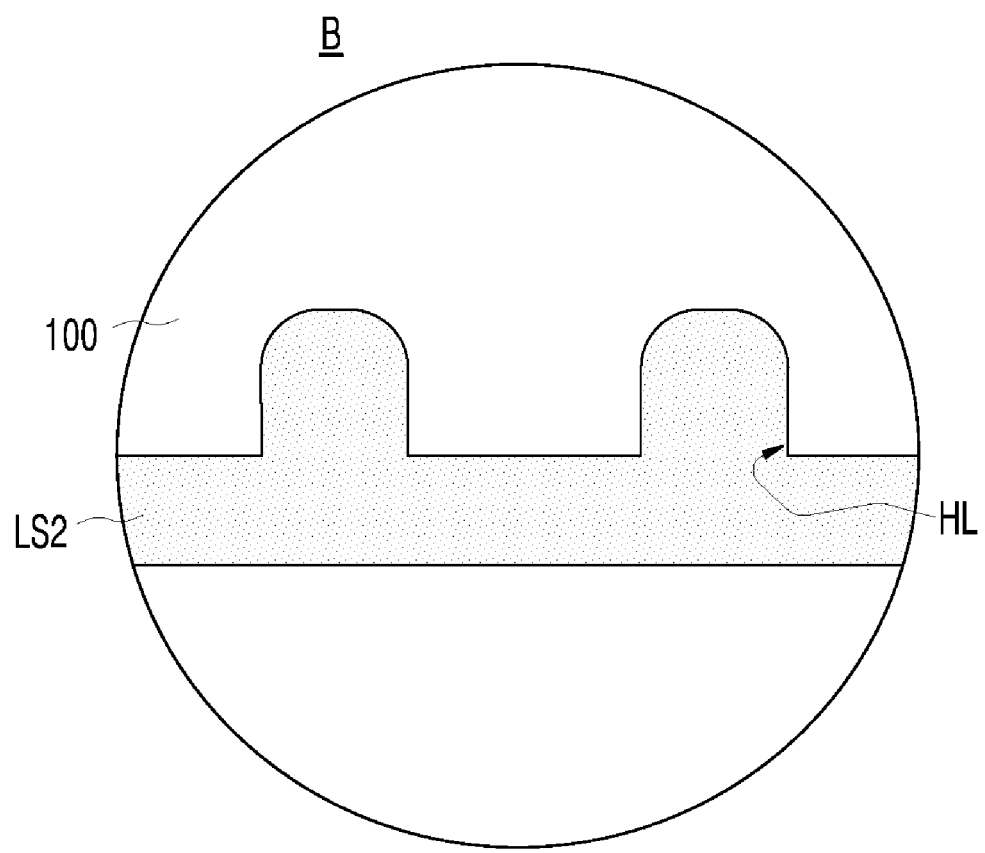

FIG. 6A is top view of a light emitting device according to still another exemplary embodiment, and FIG. 6B is a cross-sectional view taken along line A-A' of FIG. 6A. FIG. 7A is a top view of a light emitting device according to yet still another exemplary embodiment, and FIGS. 7B and 7C are cross-sectional views taken along line A-A' of FIG. 7A. FIGS. 8A and 8B are enlarged views of part B of the light emitting device illustrated in FIG. 6B. FIGS. 6A and 7A are planar views obtained when viewed from a substrate.

Referring to FIGS. 6A to 7C, a light emitting device may include a substrate 100, light emitting structures LED each including a first light emitting part LE1, a second light emitting part LE2, and a third light emitting part LE3, which are vertically stacked on a first surface SF1 of the substrate 100, a first light shielding layer LS1 disposed between the light emitting structures LED on the first surface SF1 of the substrate 100, and a second light shielding layer LS2 disposed on a second surface SF2 of the substrate 100 opposing the first surface SF1.

The first surface SF1 of the substrate 100 may include light emitting areas LEA, in which the light emitting structures LED are disposed, and a light shielding area LSA surrounding the light emitting areas LEA and in which the first light shielding layer LS1 is disposed. For example, each light emitting area LEA may have a first width W1.

According to exemplary embodiments illustrated in FIGS. 6B and 7B, the first surface SF1 of the substrate 100 may be substantially flat.

According to another exemplary embodiment illustrated in FIG. 7C, the first surface SF1 of the substrate 100 may include a plurality of first holes HL1. In this case, the first holes HL1 disposed in the light shielding area LSA may be filled with the first light shielding layer LS1. However, the inventive concepts are not limited thereto, and in some exemplary embodiments, the first holes HL1 disposed in the light emitting areas LEA may be filled with air.

While the first holes HL1 in FIG. 7C are illustrated as being formed on the entire first surface SF1 of the substrate 100, in some exemplary embodiments, the first holes HL1 may be selectively formed only in the light emitting areas LEA of the first surface SF1 of the substrate 100, or may be selectively formed only in the light shielding area LSA of the first surface SF1 of the substrate 100. The first holes HL1 may be regularly arranged by being separated from one another by the same distance, and may have the same structure. In some exemplary embodiments, the first holes HL1 may be irregularly arranged, and/or may have different structures.

In addition, while each of the first holes HL1 filled with the first light shielding layer LS1 in FIG. 7C is illustrated as having a conical structure, however, in some exemplary embodiments, each of the first holes HL1 may have a cylindrical structure.

Referring to FIGS. 6A to 7C, the second surface SF2 of the substrate 100 may include a plurality of second holes HL2. According to an exemplary embodiment, each of the second holes HL2 may have substantially a conical structure, as shown in FIG. 8A. According to another exemplary embodiment, each of the second holes HL2 may have substantially a cylindrical structure, as shown in FIG. 8B.

For example, the second holes HL2 may be regularly arranged by being separated from one another by the same distance, and may have the same structure. In some exemplary embodiments, however, the second holes HL2 may be irregularly arranged, and/or may have different structures.

While the second holes HL2 of FIGS. 6B, 7B, and 7C are illustrated as being formed on the entire second surface SF2 of the substrate 100, however, the inventive concepts are not limited thereto. For example, in some exemplary embodiments, the second holes HL2 may be selectively formed only in regions corresponding to light extraction surfaces LEX, may be selectively formed only in regions corresponding to the light emitting areas LEA of the first surface SF1 of the substrate 100, or may be selectively formed only in a region corresponding to the light shielding area LSA of the first surface SF1 of the substrate 100.

According to an exemplary embodiment, the second light shielding layer LS2 may be disposed in the second holes HL2, and may include openings that at least partially overlap with the light emitting areas LEA. The openings may be disposed within the light emitting areas LEA of the first surface SF1 of the substrate 100, and may have a third width W3 less than the first width W1 of the light emitting areas LEA. The second surface SF2 of the substrate 100 exposed by the openings may be the light extraction surfaces LEX. The light extraction surfaces LEX may have the third width W3 that less than the first width W1 of the light emitting areas LEA.

According to the illustrated exemplary embodiment of FIG. 6B, the second holes HL2 disposed within the openings of the second light shielding layer LS2 may be exposed to an outside. More particularly, air may be filled in the second holes HL2 disposed within the openings of the second light shielding layer LS2. According to another exemplary embodiment illustrated in FIGS. 7B and 7C, the second light shielding layer LS2 may be filled at least in some of the second holes HL2 disposed within the openings.

In this manner, as the second light shielding layer LS2 covers portions of the light emitting areas LEA, and thereby defines the light extraction surfaces LEX having a smaller area, the contrast of light emitting device may be improved. Also, as light is diffusively reflected by the plurality of second holes HL2, which are disposed within the light extraction surfaces LEX, the light extraction of the light emitting device may be improved. By the first light shielding layer LS1 and the second light shielding layer LS2, it is possible to prevent light generated from neighboring light emitting structures LED from being mixed with each other. Since the first holes HL1, which are filled with the first light shielding layer LS1, and the second light shielding layer LS2, which is disposed in a region excluding the light extraction surfaces LEX, may reflect, absorb, and/or shield light generated from neighboring light emitting structures LED, a color mixing may be prevented while improving color reproducibility.

Since the elements of the light emitting device shown in FIGS. 6A to 8B are substantially the same as those described above with reference to FIGS. 1A to 3B, repeated descriptions thereof will be omitted to avoid redundancy.

Hereinafter, a method for manufacturing a light emitting device according to an exemplary embodiment will be described. In the illustrated exemplary embodiment, the light emitting device will be described with reference to that shown in FIGS. 1A, 1B, and 1D.

FIGS. 9 to 13 are cross-sectional views illustrating a method for manufacturing a light emitting device according to an exemplary embodiment.

Figure 9:
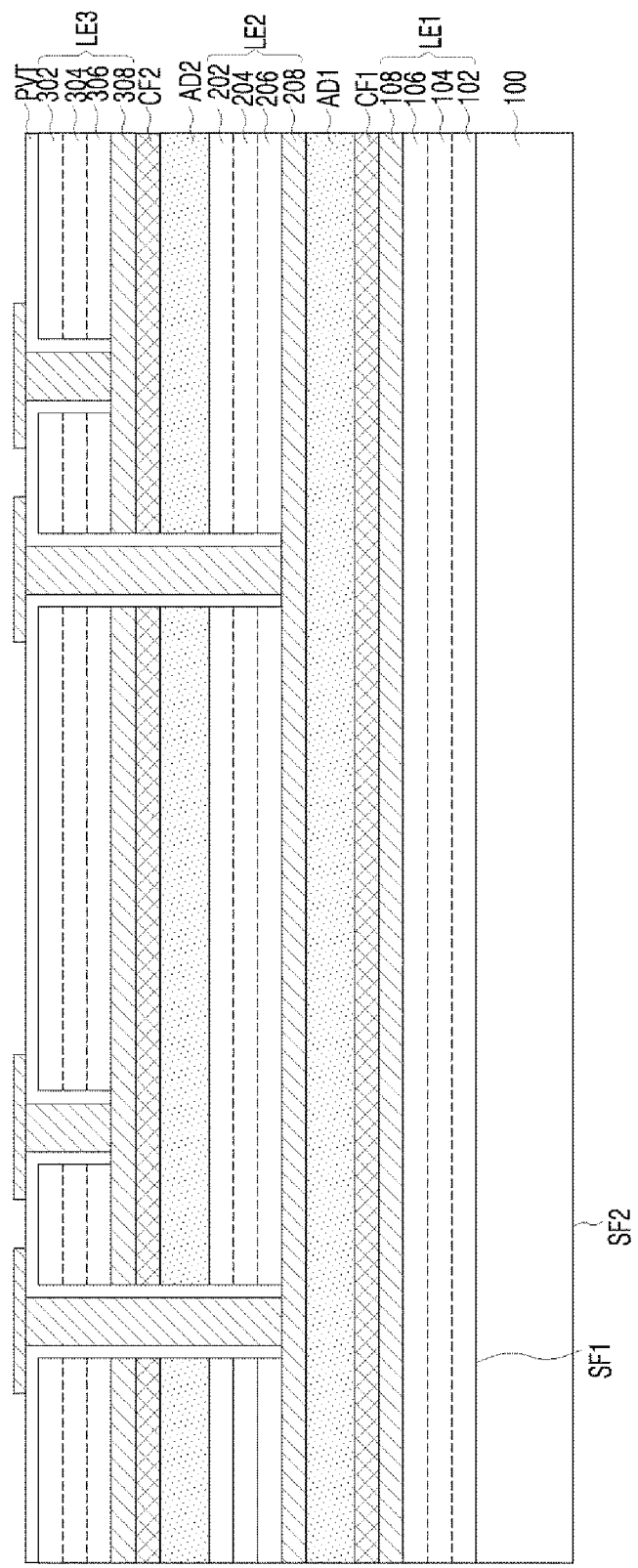
FIGS. 9, 10, 11, 12, and 13 are cross-sectional views illustrating a method for manufacturing a light emitting device according to an exemplary embodiment.

Referring to FIG. 9, a first n-type semiconductor layer 102, a first active layer 104, a first p-type semiconductor layer 106, and a first ohmic layer 108 may be sequentially formed on a first substrate 100, to form a first light emitting part LE1. The first n-type semiconductor layer 102, the first active layer 104, and the first p-type semiconductor layer 106 may be sequentially formed on the first substrate 100 by using a growing method, such as MOCVD (metal organic chemical vapor deposition), MBE (molecular beam epitaxy), HVPE (hydride vapor phase epitaxy), and MOC (metal-organic chloride). The first ohmic layer 108 may be formed on the first p-type semiconductor layer 106 by using a chemical vapor deposition (CVD) process, physical vapor deposition (PVD), and the like.

By sequentially forming a second n-type semiconductor layer 202, a second active layer 204, a second p-type semiconductor layer 206, and a second ohmic layer 208 on a second substrate, a second light emitting part LE2 may be formed. The second n-type semiconductor layer 202, the second active layer 204, and the second p-type semiconductor layer 206 may be sequentially formed on the second substrate by using a growing method, such as MOCVD, MBE, HVPE, and MOC. The second ohmic layer 208 may be formed on the second p-type semiconductor layer 206 through a CVD process, a PVD process, and the like.

By turning over the second substrate, the second ohmic layer 208 may be disposed to face the first ohmic layer 108, and the second light emitting part LE2 may be bonded to the first light emitting part LE1 through a first adhesion part AD1. After bonding the first light emitting part LE1 and the second light emitting part LE2, the second substrate may be removed through a laser lift-off (LLO) process or a chemical lift-off (CLO) process.

By sequentially forming a third n-type semiconductor layer 302, a third active layer 304, a third p-type semiconductor layer 306, and a third ohmic layer 308 on a third substrate, a third light emitting part LE3 may be formed. The third n-type semiconductor layer 302, the third active layer 304, and the third p-type semiconductor layer 306 may be sequentially formed on the third substrate by using a growing method, such as MOCVD, MBE, HVPE, and MOC. The third ohmic layer 308 may be formed on the third p-type semiconductor layer 306 through a CVD process, a PVD process, and the like.

The third substrate may be turned over such that the second n-type semiconductor layer 202 of the second light emitting part LE2 and the third ohmic layer 308 of the third light emitting part LE3 face each other, and the second light emitting part LE2 and the third light emitting part LE3 may be bonded to each other through a second adhesion part AD2. After bonding the second light emitting part LE2 and the third light emitting part LE3 by the second adhesion part AD2, the third substrate may be removed through an LLO or CLO process.

Then, by etching the third light emitting part LE3, the second light emitting part LE2, and the first light emitting part LE1, a first via hole exposing the first ohmic layer 108, a second via hole exposing the second ohmic layer 208, a third via hole exposing the third ohmic layer 308, a fourth via hole exposing the first n-type semiconductor layer 102, a fifth via hole exposing the second n-type semiconductor layer 202, and a sixth via hole exposing the third n-type semiconductor layer 302 may be formed.

According to an exemplary embodiment, while forming the first via hole, the second via hole, the third via hole, the fourth via hole, the fifth via hole, and the sixth via hole, the first light emitting part LE1, the second light emitting part LE2, and the third light emitting part LE3 may be etched to expose the substrate 100, and thus, the light emitting devices may be individually separated from one another.

A passivation layer PVT may be formed to at least partially fill the first via hole, the second via hole, the third via hole, the fourth via hole, the fifth via hole, and the sixth via hole, and to extend to the top surface of the third n-type semiconductor layer 302.

By etching the passivation layer PVT, the first n-type semiconductor layer 102 may be exposed at the bottom surface of the fourth via hole, the second n-type semiconductor layer 202 may be exposed at the bottom surface of the fifth via hole, the third n-type semiconductor layer 302 may be exposed at the bottom surface of the sixth via hole, the first ohmic layer 108 may be exposed at the bottom surface of the first via hole, the second ohmic layer 208 may be exposed at the bottom surface of the second via hole, and the third ohmic layer 308 may be exposed at the bottom surface of the third via hole.

A first via pattern VA1, a second via pattern VA2, a third via pattern VA3, a fourth via pattern VA4, a fifth via pattern VA5, and a sixth via pattern VA6 may be formed in the first via hole, the second via hole, the third via hole, the fourth via hole, the fifth via hole, and the sixth via hole, respectively, along with the passivation layer PVT.

The first via pattern VA1 may be disposed in the first via hole and be brought into electrical contact with the first ohmic layer 108, the second via pattern VA2 may be disposed in the second via hole and be brought into electrical contact with the second ohmic layer 208, the third via pattern VA3 may be disposed in the third via hole and be brought into electrical contact with the third ohmic layer 308, the fourth via pattern VA4 may be disposed in the fourth via hole and be brought into electrical contact with the first n-type semiconductor layer 102, the fifth via pattern VA5 may be disposed in the fifth via hole and be brought into electrical contact with the second n-type semiconductor layer 202, and the sixth via pattern VA6 may be disposed in the sixth via hole and be brought into electrical contact with the third n-type semiconductor layer 302.

According to an exemplary embodiment, the top surface of each of the first via pattern VA1, the second via pattern VA2, the third via pattern VA3, the fourth via pattern VA4, the fifth via pattern VA5, and the sixth via pattern VA6 may be coplanar with the top surface of the passivation layer PVT.

A first pad PD1 that is brought into electrical contact with the first via pattern VA1 may be formed on the first via pattern VA1, a second pad PD2 that is brought into electrical contact with the second via pattern VA2 may be formed on the second via pattern VA2, a third pad PD3 that is brought into electrical contact with the third via pattern VA3 may be formed on the third via pattern VA3, and a common pad CPD that is brought into electrical contact in common with the fourth via pattern VA4, the fifth via pattern VA5, and the sixth via pattern VA6 may be formed on the fourth via pattern VA4, the fifth via pattern VA5, and the sixth via pattern VA6.

Figure 10:
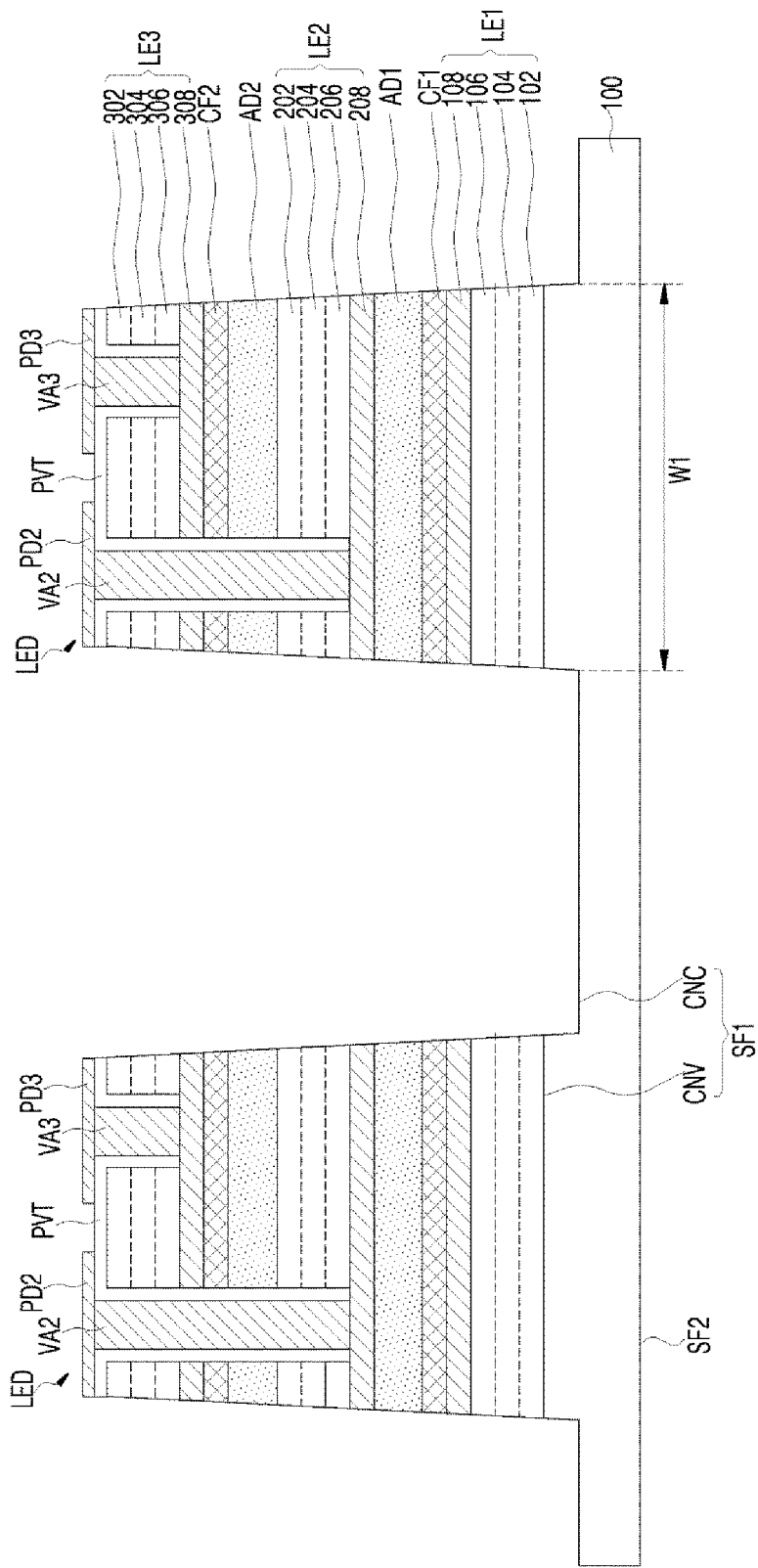

Referring to FIG. 10, by sequentially etching the third light emitting part LE3, the second light emitting part LE2, and the first light emitting part LE1, the light emitting structures LED formed on the substrate 100 may be individualized from one another.

According to an exemplary embodiment, during the etching process, portions of the substrate 100 under the first light emitting part LE1 may be etched. In this manner, a first surface SF1 of the substrate 100 may include convex parts CNV covered by the light emitting structure LED, and a concave part CNC from being etched. However, in some exemplary embodiments, the first surface SF1 of the substrate 100 may not be etched during the etching process, as shown in FIGS. 1C, 1E, and 2B.

According to an exemplary embodiment, the light emitting structures LED may have inclined sidewalls with a predetermined slope. However, the inventive concepts are not limited thereto, and in some exemplary embodiments, the light emitting structures LED may have the sidewalls that are vertically formed.

Figure 11:
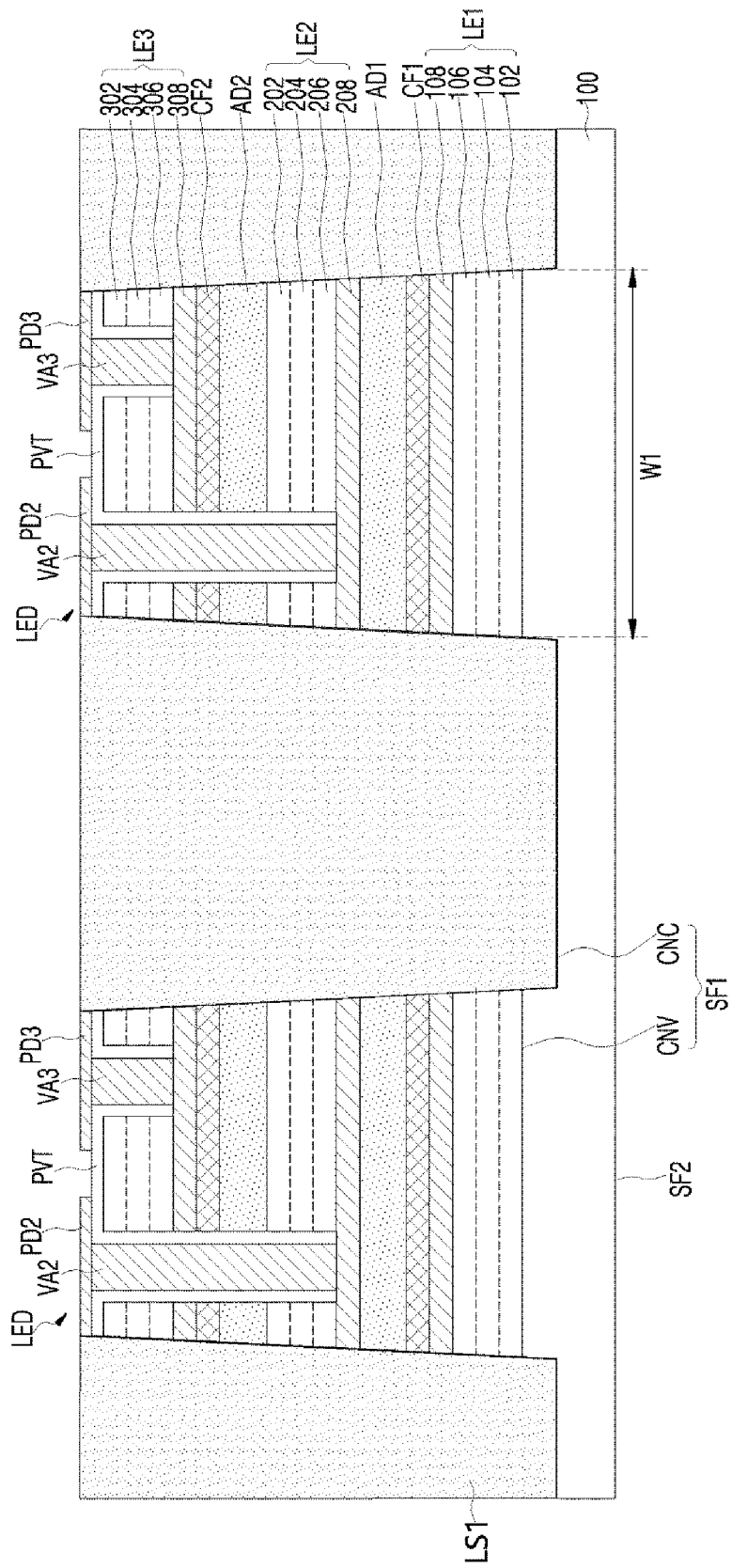

Referring to FIG. 11, a first light shielding layer LS1 may be disposed between the light emitting structures LED. According to an exemplary embodiment, the first light shielding layer LS1 may be formed in the concave part CNC of the first surface SF1 of the substrate 100. The first light shielding layer LS1 may cover the sidewalls of the substrate 100 that are formed during the etching process. In this manner, light emitting areas LEA may be defined. When each of the light emitting structures LED has a width that gradually increases from the third light emitting part LE3 to the first light emitting part LE1, each of the light emitting areas LEA may have a first width W1 that is substantially the same as the greatest width of each light emitting structure LED.

For example, the first light shielding layer LS1 may have a top surface disposed on substantially the same level as the top surfaces of the first pad PD1, the second pad PD2, the third pad PD3, and the common pad CPD of the light emitting structure LED.

As another example, the first pad PD1, the second pad PD2, the third pad PD3, and the common pad CPD may not be formed during the process illustrated in FIG. 9. More particularly, the first pad PD1, the second pad PD2, the third pad PD3 and the common pad CPD may be formed to extend onto the first light shielding layer LS1, after forming the first light shielding layer LS1.

Figure 12:
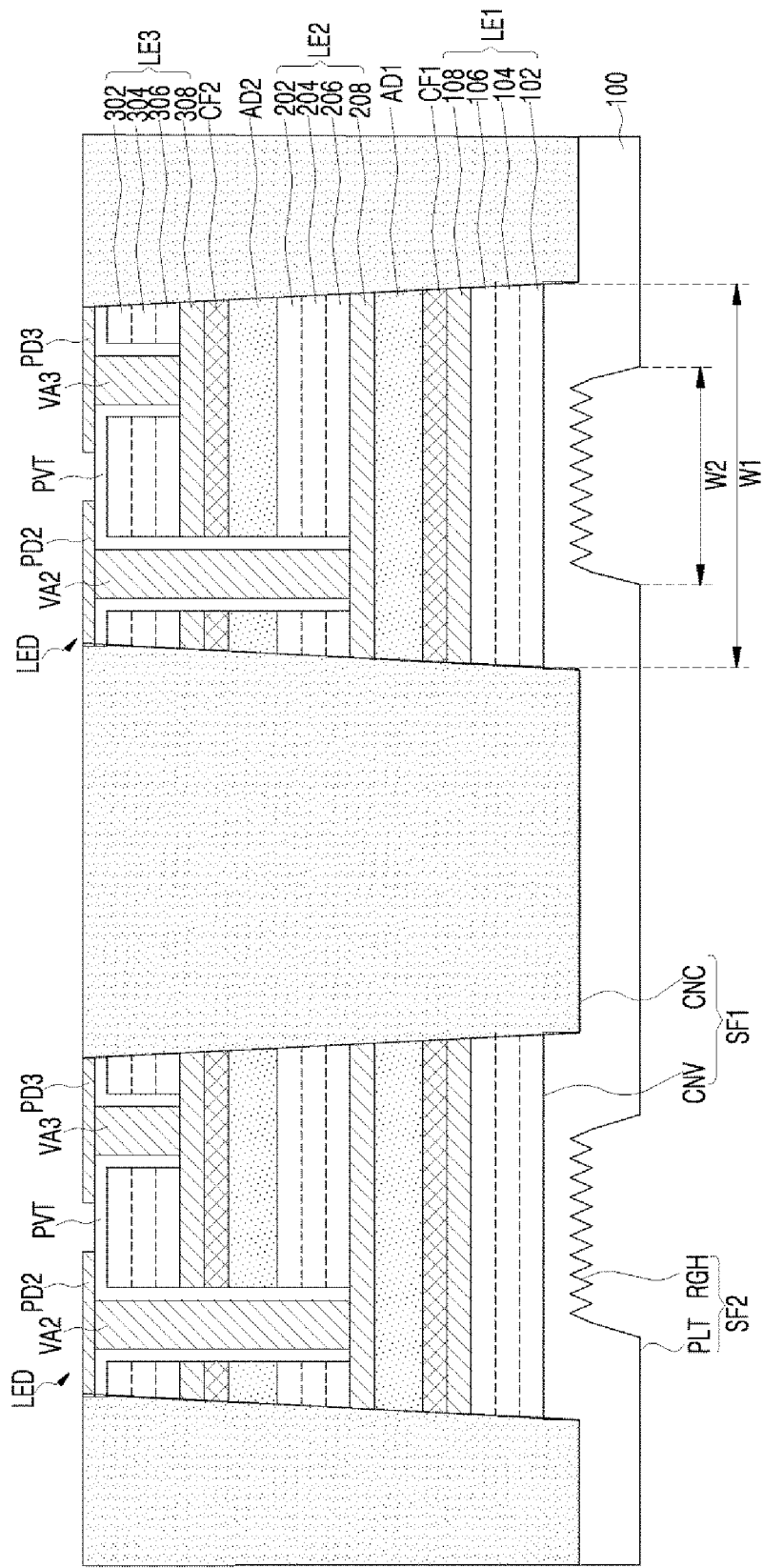

Referring to FIG. 12, by etching a second surface SF2 of the substrate 100, rough surfaces RGH each including convex and concave pattern CC may be formed.

In particular, by forming a mask pattern on the second surface SF2 of the substrate 100, and etching the second surface SF2 through wet etching and/or dry etching using the mask pattern as an etch mask, the convex and concave pattern CC may be formed. After forming the rough surfaces RGH, the mask pattern may be removed.

The rough surfaces RGH each including the convex and concave pattern CC may be formed to overlap at least portions of the light emitting areas LEA. According to an exemplary embodiment, the rough surfaces RGH may be formed within the light emitting areas LEA, and may have a second width W2 less than the first width W1. The center of each rough surface RGH may be concentric with the center of each light emitting area LEA. According to another exemplary embodiment, each rough surface RGH may have a second width W2 greater than or equal to the first width W1, as shown in FIG. 1E. The center of each rough surface RGH may be concentric with the center of each light emitting area LEA.

Figure 13:
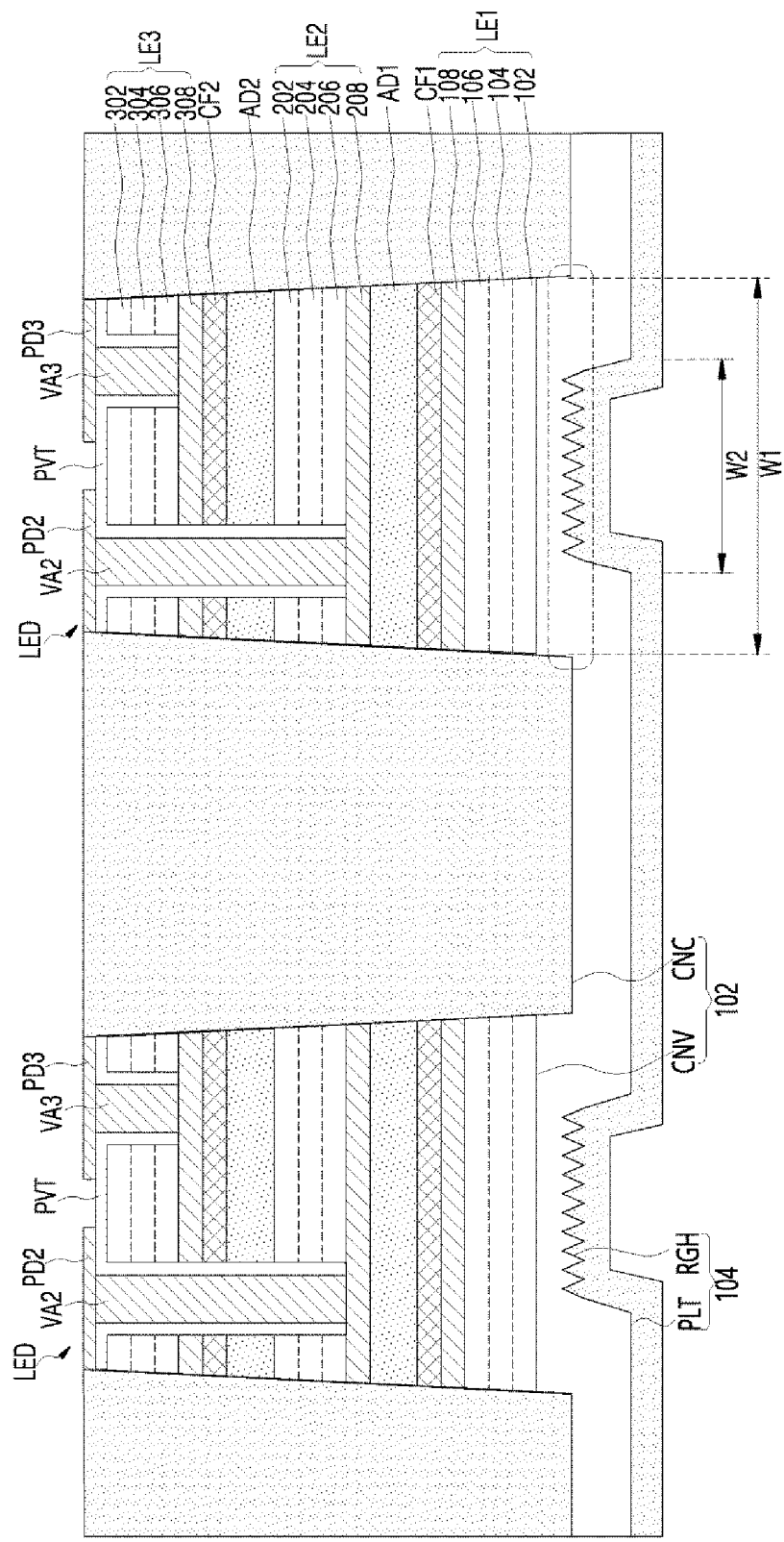

Referring to FIG. 13, a second light shielding layer LS2 may be formed on the second surface SF2 of the substrate 100. The second light shielding layer LS2 having a thin thickness may be formed continuously along the rough surfaces RGH and a flat surface PLT of the second surface SF2 of the substrate 100.

According to an exemplary embodiment, the first light shielding layer LS1 formed on the concave part CNC of the first surface SF1 of the substrate 100 and the second light shielding layer LS2 formed on the rough surfaces RGH of the second surface SF2 of the substrate 100 may overlap with each other.

Referring back to FIG. 1D, by etching the second light shielding layer LS2, openings that expose portions of the second surface SF2 of the substrate 100 may be formed and define light extraction surfaces LEX, which may have a third width W3 less than the second width W2.

Figure 5A:
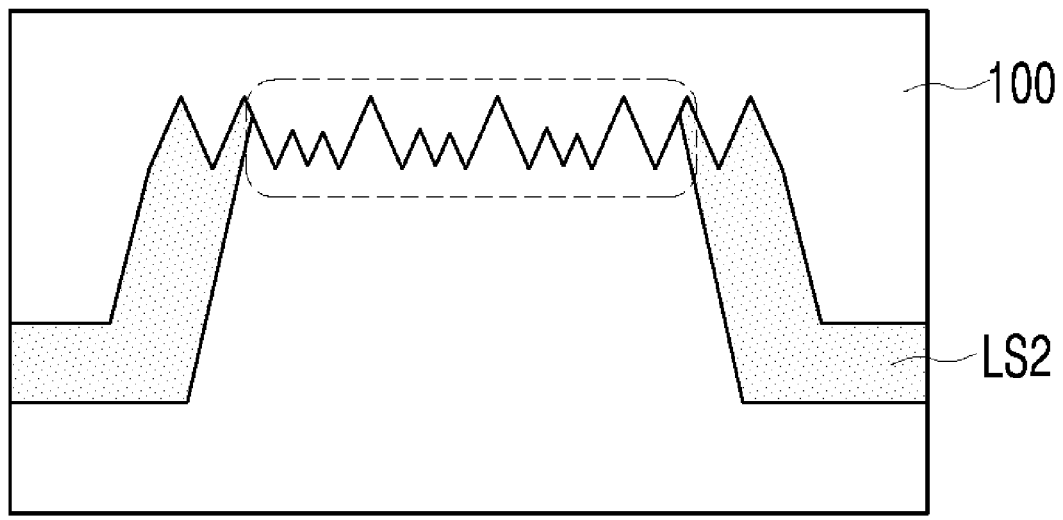
Figure 5B:
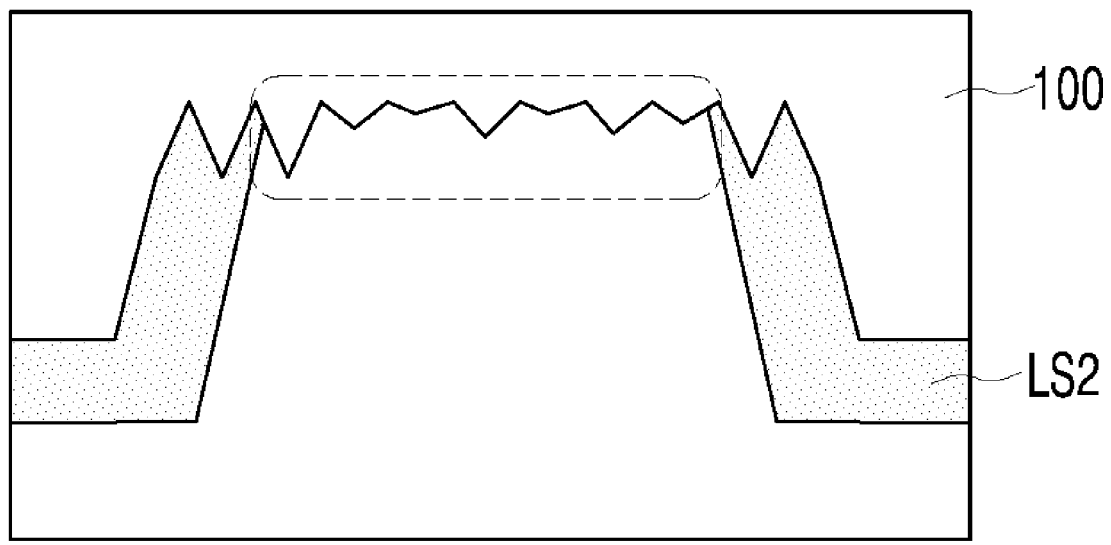

According to an exemplary embodiment, while etching the second light shielding layer LS2, portions of the rough surfaces RGH from which the second light shielding layer LS2 is removed may be further etched in addition to the etching process illustrated with reference to FIG. 12. In this manner, portions of the rough surfaces RGH may be secondarily etched to have a roughness different from the portions of the rough surfaces RGH covered by the second light shielding layer LS2, as shown in FIGS. 5A and 5B. Referring to FIG. 5A, the portions of the rough surfaces RGH covered by the second light shielding layer LS2 may have a first roughness, and the portions of the rough surfaces RGH exposed by the second light shielding layer LS2 may have a second roughness greater than the first roughness. Referring to FIG. 5B, the portions of the rough surfaces RGH covered by the second light shielding layer LS2 may have a first roughness, and the portions of the rough surfaces RGH exposed by the second light shielding layer LS2 may have a second roughness less than the first roughness.

In some exemplary embodiments, the rough surfaces RGH may be formed after forming the second light shielding layer LS2. When the rough surfaces RGH are formed after forming the second light shielding layer LS2, the light emitting device may have the structure illustrated in FIGS. 2A and 2B.

In the light emitting device according to exemplary embodiments, light generated from neighboring light emitting structures may be prevented from being mixed by first and second light shielding layers, and thus, color reproducibility may be improved.

In addition, since a substrate is formed to have a thin thickness in a region where a rough surface is formed while retaining a normal thickness in the remaining regions, the substrate may support a plurality of light emitting structures and may not easily be damaged by an external shock.

Furthermore, light generated by a light emitting structure is diffusively reflected by the rough surface, which may improve light efficiency. In addition, as the light shielding layer covers the ends of the rough surface, a light extraction surface may be defined, by which the contrast of the light emitting device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a substrate having a first surface and a second surface opposing the first surface, the substrate including a concave portion penetrating into the substrate from the second surface;
a light emitting structure disposed on the first surface of the substrate and defining a light emitting area; and
a first light shielding layer disposed on the second surface of the substrate and exposing at least a portion of the light emitting area,
wherein the second surface of the substrate has a rough surface formed in the concave portion and that overlaps at least a portion the light emitting area, and the second surface of the substrate includes a sidewall connected to the rough surface, and
wherein the first light shielding layer covers at least a portion of the rough surface, extends to the sidewall of the substrate, and defines a light extraction surface of the light emitting structure.

2. The light emitting device according to claim 1, wherein the light extraction surface has a width less than that of the rough surface and that of the light emitting area.

3. The light emitting device according to claim 1, wherein:
the rough surface includes a convex and concave pattern; and
a roughness of a portion of the convex and concave pattern formed in the light extraction surface is different from that of a portion of the convex and concave pattern covered by the first light shielding layer.

4. The light emitting device according to claim 1, wherein the first light shielding layer has substantially the same width along the sidewall of the substrate.

5. The light emitting device according to claim 1, wherein:
the sidewall of the substrate is inclined with a predetermined slope; and
the first light shielding layer has a width that gradually decreases from the second surface of the substrate toward an inside of the substrate, and has a side surface vertically extending from the second surface of the substrate.

6. The light emitting device according to claim 1, wherein the rough surface is disposed within the light emitting area, and has a width less than the light emitting area.

7. The light emitting device according to claim 1, wherein the rough surface covers the light emitting area, and has a width equal to or greater than the light emitting area.

8. A light emitting device comprising:
a substrate having a first surface and a second surface opposing the first surface;
a light emitting structure disposed on the first surface of the substrate and defining a light emitting area;
a first light shielding layer disposed on the second surface of the substrate and exposing at least a portion of the light emitting area; and
a second light shielding layer disposed on the first surface of the substrate and surrounding an outer side of the light emitting structure,
wherein the first surface of the substrate has a convex part in the light emitting area and a concave part in an area excluding the light emitting area,
wherein the second light shielding layer is disposed in the concave part of the substrate, and
wherein the second surface of the substrate has a rough surface that overlaps at least a portion the light emitting area.

9. The light emitting device according to claim 8, wherein a portion of the second light shielding layer disposed in the concave part and a portion of the first light shielding layer covering at least a portion of the rough surface of the substrate overlap with each other.

10. A light emitting device comprising:
a substrate having a first surface and a second surface opposing the first surface;
a light emitting structure disposed on the first surface of the substrate and defining a light emitting area;
a first light shielding layer disposed on the second surface of the substrate and exposing at least a portion of the light emitting area; and
a second light shielding layer disposed on the first surface of the substrate and surrounding an outer side of the light emitting structure,
wherein the second surface of the substrate has a rough surface that overlaps at least a portion the light emitting area, and
wherein the rough surface includes a plurality of first holes, and at least a portion of the first holes are disposed in the light emitting area.

11. The light emitting device according to claim 10, wherein the first light shielding layer is disposed in the first holes, extends along the second surface of the substrate to cover at least a portion of the light emitting area, and defines a light extraction surface of the light emitting structure.

12. The light emitting device according to claim 11, wherein the light extraction surface has a width less than that of the light emitting area.

13. The light emitting device according to claim 10, wherein:
the first light shielding layer defines a light extraction surface of the light emitting structure; and
the first holes formed in the light extraction surface are filled with air.

14. The light emitting device according to claim 11, wherein the first holes formed in the light extraction surface are filled with the first light shielding layer.

15. The light emitting device according to claim 10, wherein:
- the first surface of the substrate includes a plurality of second holes; and
- the second light shielding layer is disposed in at least a portion of the second holes.

* * * * *